US012203966B2

(12) United States Patent
Zhu

(10) Patent No.: US 12,203,966 B2
(45) Date of Patent: Jan. 21, 2025

(54) AC/DC VOLTAGE DETECTION CIRCUIT

(71) Applicant: Hypower Microelectronics (Wuxi) Co., Ltd., Wuxi (CN)

(72) Inventor: Ning Zhu, Wuxi (CN)

(73) Assignee: Hypower Microelectronics (Wuxi) Co., Ltd., Wuxi (CN)

( * ) Notice: Subject to any disclaimer, the term of this patent is extended or adjusted under 35 U.S.C. 154(b) by 0 days.

(21) Appl. No.: 18/380,154

(22) Filed: Oct. 13, 2023

(65) Prior Publication Data

US 2024/0044953 A1 Feb. 8, 2024

Related U.S. Application Data

(63) Continuation of application No. 17/467,464, filed on Sep. 7, 2021, now Pat. No. 11,828,777.

(30) Foreign Application Priority Data

Jun. 22, 2021 (CN) .......................... 202110690635.9

(51) Int. Cl.
*G01R 19/25* (2006.01)
*H03K 5/24* (2006.01)

(52) U.S. Cl.
CPC ........... *G01R 19/2509* (2013.01); *H03K 5/24* (2013.01)

(58) Field of Classification Search
CPC .............................. G01R 19/155; G01R 19/15
See application file for complete search history.

(56) References Cited

U.S. PATENT DOCUMENTS

| 8,502,510 B2* | 8/2013 | Sheng | H02M 3/156 |
| | | | 323/284 |
| 10,374,508 B2* | 8/2019 | Gong | H02M 1/126 |
| 2012/0105016 A1* | 5/2012 | Moon | H02M 1/36 |
| | | | 320/166 |
| 2016/0164430 A1 | 6/2016 | Chen et al. | |

FOREIGN PATENT DOCUMENTS

| CN | 102457180 A | 5/2012 |
| CN | 203352426 U | 12/2013 |
| CN | 104617929 A | 5/2015 |
| CN | 106291114 A | 1/2017 |
| CN | 108599594 A | 9/2018 |
| CN | 109510481 A | 3/2019 |
| CN | 109638785 A | 4/2019 |
| CN | 110596517 A | 12/2019 |
| CN | 112019069 A | 12/2020 |
| JP | H04346077 A | 12/1992 |

* cited by examiner

*Primary Examiner* — Manish S Shah
*Assistant Examiner* — Sharad Timilsina
(74) *Attorney, Agent, or Firm* — FIDELI LAW PLLC

(57) ABSTRACT

The present disclosure provides an alternating current (AC)/direct current (DC) voltage detection circuit, which includes a rising edge trigger circuit and a detection and output circuit connected to an output terminal of the rising edge trigger circuit. When the detection and output circuit detects that the output signal of the rising edge trigger circuit undergoes preset m target flips in M consecutive clock periods, the detection and output circuit generates an AC determination signal, where m is a natural number.

15 Claims, 14 Drawing Sheets

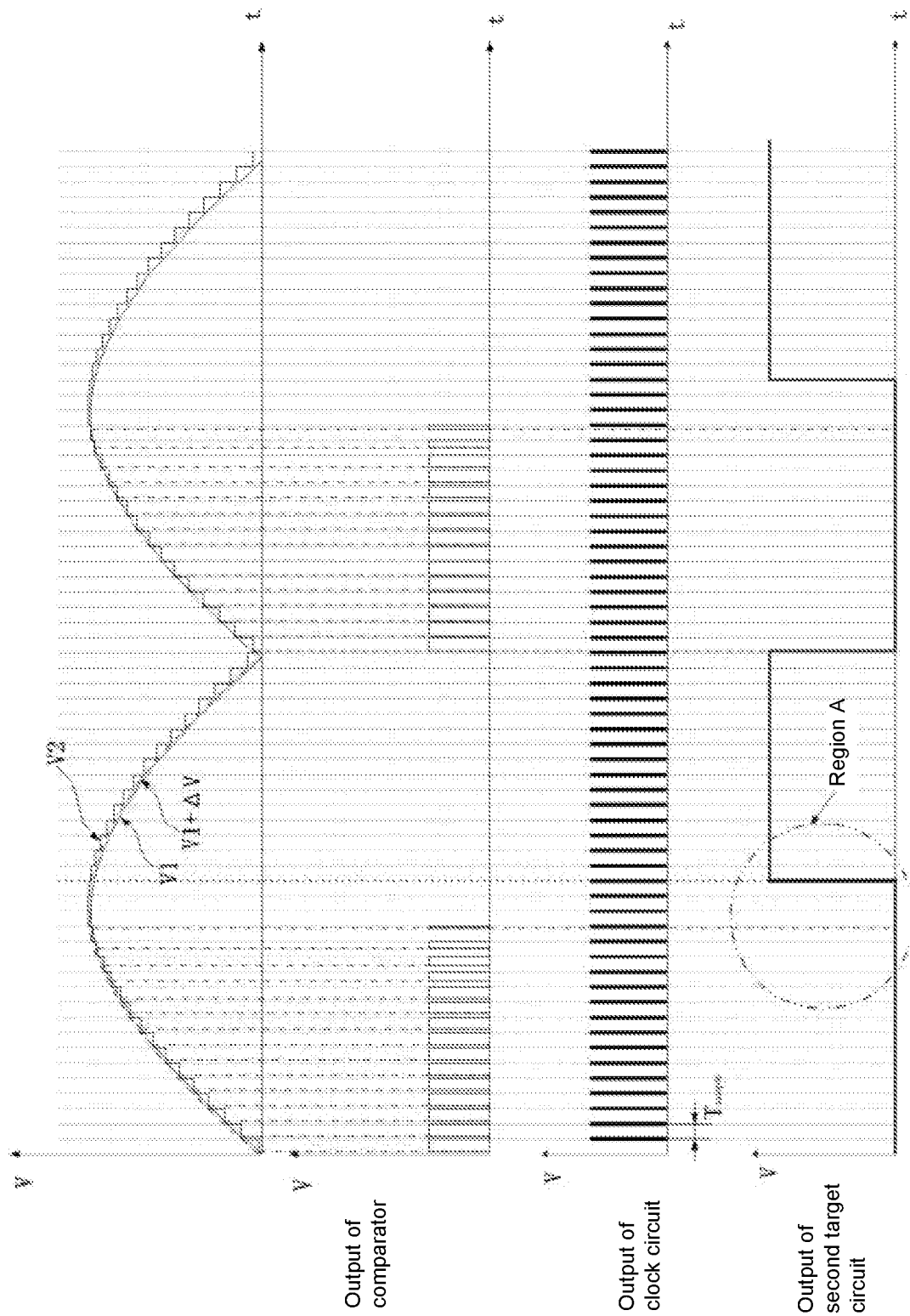

AC/DC VOLTAGE DETECTION CIRCUIT

RELATED APPLICATION

The present application claims the benefit of priority to the U.S. patent application Ser. No. 17/467,464, filed Sep. 7, 2021, which claims the benefit of priority to the Chinese Patent Application No. 202110690635.9, filed on Jun. 22, 2021, and entitled "AC/DC Voltage Detection Circuit," the entire contents of the foregoing documents are incorporated herein by reference.

TECHNICAL FIELD

The present disclosure relates to the technical field of integrated circuits (ICs), and in particular to an alternating current (AC)/direct current (DC) voltage detection circuit.

BACKGROUND

In some cases, a specially designed circuit is required in an integrated circuit (IC) to detect the characteristic of an electrical signal. For example, in some applications, it is necessary to detect the voltage of an input signal so as to determine whether the input signal is an alternating current (AC) signal or a direct current (DC) signal. The circuit needs to have high detection accuracy to ensure the performance of the IC, and it cannot be too complicated in order to reduce the cost and volume of the IC.

BRIEF SUMMARY

In order to solve the above-mentioned problems, the present disclosure provides an alternating current (AC)/direct current (DC) voltage detection circuit. The AC/DC voltage detection circuit can detect the voltage of an AC line, determine the AC/DC characteristic of an input signal, and achieve a balance between circuit complexity, detection accuracy and sufficiently fast detection speed, thereby achieving a balance between the optimal performance and cost of an integrated circuit (IC).

The AC/DC voltage detection circuit includes: a rising edge trigger circuit, including an input terminal and an output terminal, where the rising edge trigger circuit samples an operating voltage received by the input terminal with a preset clock period, the clock period is configured to enable the rising edge trigger circuit to sample M times to an AC voltage of a rated frequency at its rising edge, where M is a natural number, when an increase of the operating voltage at the rising edge of the operating voltage within the preset clock period is greater than a preset bias voltage, an output signal of the output terminal undergoes at least one target flip between a high level and a low level; and a detection and output circuit, connected to the output terminal of the rising edge trigger circuit, and configured to detect a change of the operating voltage and the target flip, where when the detection and output circuit detects that the output signal of the rising edge trigger circuit undergoes preset m target flips in M consecutive clock periods, the detection and output circuit generates an AC determination signal, where m is a natural number.

BRIEF DESCRIPTION OF THE DRAWINGS

The present disclosure will be further described based on exemplary embodiments. The above and other aspects of the embodiments of the present disclosure will become clearer in the following detailed description when read with reference to the drawings.

FIG. 2A illustrates a timing diagram of various signals of the AC/DC voltage detection circuit in operation according to some exemplary embodiments of the present disclosure;

DETAILED DESCRIPTION

The terms used herein are merely intended to describe specific examples or embodiments, rather than to limit the present disclosure. For example, unless contexts explicitly state otherwise, the singular forms "a", "an" and "the" used herein may also include plural forms. In this disclosure, the terms "include" and/or "comprise" refer to the existence of an associated integer, step, operation, element, component and/or group, without excluding the existence of one or more other features, integers, steps, operations, elements, components and/or groups. In other words, other features, integers, steps, operations, elements, components and/or groups may be added to the system/method. In this disclosure, the term "A is on B" may mean that A is directly adjacent to B (above or below), or that A and B are indirectly adjacent (that is, A and B are separated by an object). The term "A is in B" may mean that A is completely in B or A is partially in B.

In the following description of the present disclosure, the economical efficiency of the features, the operation and function of related elements of the structure, as well as the combination and manufacturing of the components can be significantly improved. All of these aspects form part of the present disclosure with reference to the drawings. However, it should be understood that the drawings are merely intended for illustration purposes, rather than to limit the scope of the present disclosure.

Figure 1:
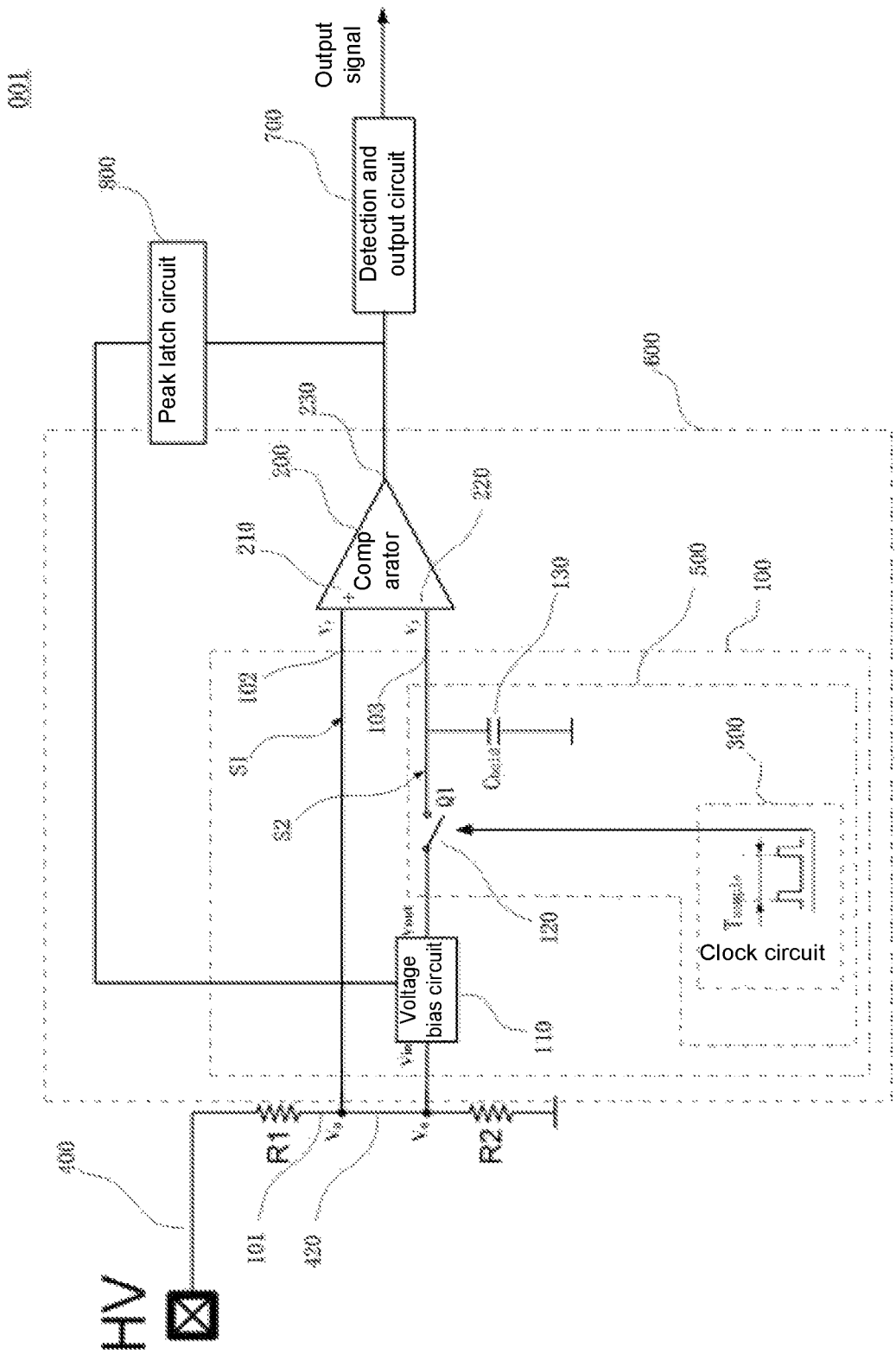
FIG. 1 illustrates a structure of an AC/DC voltage detection circuit according to some exemplary embodiments of the present disclosure.

As an example, FIG. 1 illustrates a structure of an AC/DC voltage detection circuit 001 according to some exemplary embodiments of the present disclosure. As an example, FIG. 2A illustrates a timing diagram of various signals of the AC/DC voltage detection circuit in operation according to some exemplary embodiments of the present disclosure. Specifically, the AC/DC voltage detection circuit 001 may include a rising edge trigger circuit 600 and a detection and output circuit 700. As an example, the rising edge trigger circuit 600 may include a voltage adjustment circuit 100 and a comparator 200. In some exemplary embodiments, the AC/DC voltage detection circuit 001 may further include a voltage divider circuit 400 and/or a latch circuit 800.

The voltage divider circuit 400 may include any circuit for dividing a signal $V_{HV}$ input through a high voltage (HV) pin into an operating voltage signal $V_0$. For example, as shown in FIG. 1, the voltage divider circuit 400 may include a first resistor $R_1$ and a second resistor $R_2$ connected in series. An output terminal 420 of the voltage divider circuit 400 may be connected between the first resistor $R_1$ and the second resistor $R_2$. One terminal of the voltage divider circuit 400 may be connected to the voltage input HV pin, and the other terminal thereof may be connected to a ground wire GND. In this way, by reasonably designing the resistance of the first resistor $R_1$ and the second resistor $R_2$, the voltage divider circuit 400 may divide the input voltage signal $V_{HV}$ into the operating voltage signal $V_0$ at the output terminal 420.

The operating voltage signal $V_0$ may be an AC signal or a DC signal. For ease of description, in the following description of the present disclosure, the working mechanism of the AC/DC voltage detection circuit 001 will be described by taking an AC voltage signal as the operating voltage signal. Referring to FIG. 2A, the operating voltage signal $V_0$ includes multiple periods, where the operating voltage signal in each period includes at least one rising edge and at least one falling edge. For ease of understanding, in the following description of the present disclosure, the working mechanism of the circuit provided by the present disclosure will be described by taking a mains AC signal without frequency modulation as the input signal $V_{HV}$. The frequency $f_{HV}$ of the input signal $V_{HV}$ is 50 HZ, the same as that of the mains AC signal, that is, the period of the input signal $V_{HV}$ is $T_{HV}$=20 ms. There are two rising edges and two falling edges in one period $T_{HV}$ of the input signal $V_{HV}$. The duration of one rising edge and one falling edge each is ¼ $T_{HV}$.

The comparator 200 includes a first comparator input terminal 210, a second comparator input terminal 220 and a comparator output terminal 230. One of the first comparator input terminal 210 and the second comparator input terminal 220 may be a positive terminal (an input terminal marked with "+") of the comparator 200, and the other may be a negative terminal (an input terminal marked with "−") of the comparator 200. When the voltage of the positive terminal is higher than that of the negative terminal, the comparator output terminalcomparator output terminal 230 of the comparator 200 outputs a high level. When the voltage of the negative terminal is higher than that of the positive terminal, the comparator output terminalcomparator output terminal 230 of the comparator 200 outputs a low level. Taking FIG. 1 as an example, the first comparator input terminal 210 of the comparator may be electrically connected to a first output terminal 102 of the voltage adjustment circuit to receive a first voltage $V_1$. The second comparator input terminal 220 of the comparator may be electrically connected to a second output terminal 103 of the voltage adjustment circuit to receive a second voltage $V_2$. The comparator 200 may compare the magnitudes of the first voltage signal $V_1$ and the second voltage signal $V_2$, and output a high level or a low level via the comparator output terminal 230 according to a comparison result, that is, to output the comparison result between the first voltage $V_1$ and the second voltage $V_2$. When the first voltage signal $V_1$ is higher than the second voltage signal $V_2$, the comparator outputs a high level. When the first voltage signal $V_1$ is lower than the second voltage signal V2, the comparator outputs a low level.

The detection and output circuit 700 is connected to the comparator output terminal 230. The detection and output circuit 700 detects the comparison result output by the comparator output terminal 230, and outputs a control signal based on the comparison result. As an example, the control signal may be used to control the start or stop of an integrated circuit (IC). As an example, the detection and output circuit 700 may also output a characteristic of the input signal based on the comparison result, for example, to indicate whether the type of the input signal is AC or DC. As an example, the detection and output circuit 700 may include at least one counting circuit. As an example, the counting circuit may include one or more counters for determining whether the type of the input signal is AC or DC by counting the number of flips of the output of the comparator between high and low levels.

One terminal of the latch circuit 800 may be connected to the comparator output terminal 230 of the comparator 200 and the other terminal thereof is connected to a voltage bias circuit 110. In some exemplary embodiments, the latch circuit 800 records and latches peak data of the $V_{HV}$ according to the output signal of the comparator output terminal 230 of the comparator, and transfers the peak data to the voltage bias circuit 110. The voltage bias circuit 110 automatically adjusts the magnitude of a bias voltage according to the peak data. In some exemplary embodiments, the latch circuit 800 may also latch an AC/DC latch signal representing the AC/DC characteristic of the input signal according to the output signal of the comparator output terminal 230 of the comparator.

The voltage adjustment circuit 100 may include an input terminal 101, the first output terminal 102 and the second output terminal 103. The input terminal 101 of the voltage adjustment circuit receives the operating voltage $V_0$. The first output terminal 102 of the voltage adjustment circuit outputs the first voltage $V_1$. The second output terminal 103 of the voltage adjustment circuit outputs the second voltage $V_2$ that is a stepped voltage. As an example, the second voltage $V_2$ is different from the first voltage $V_1$ by a bias voltage, i.e., $\Delta V$, at the beginning of a preset clock period $T_{sample}$, and the second voltage does not drop by more than a first amplitude in the clock period $T_{sample}$. For example, the first amplitude may be 1%, 2%, 3%, 4%, 5%, 6%, 7%, 8%, 9% or 10%, or an interval between any two of the foregoing numbers, of $\Delta V$. The magnitude of the bias voltage $\Delta V$ is related to the first voltage $V_1$.

Specifically, the voltage adjustment circuit 100 may include a voltage bias circuit 110 and a step voltage generating circuit 500.

The voltage bias circuit 110 may add the bias voltage $\Delta V$ to an input voltage $V_{in}$ of the voltage bias circuit 110 and output a voltage $V_{out}$. As an example, the voltage bias circuit 110 may include at least one of a voltage-controlled voltage source, or a voltage-controlled current source. For example, the voltage bias circuit 110 may be a voltage-controlled current source.

Figure 3A:
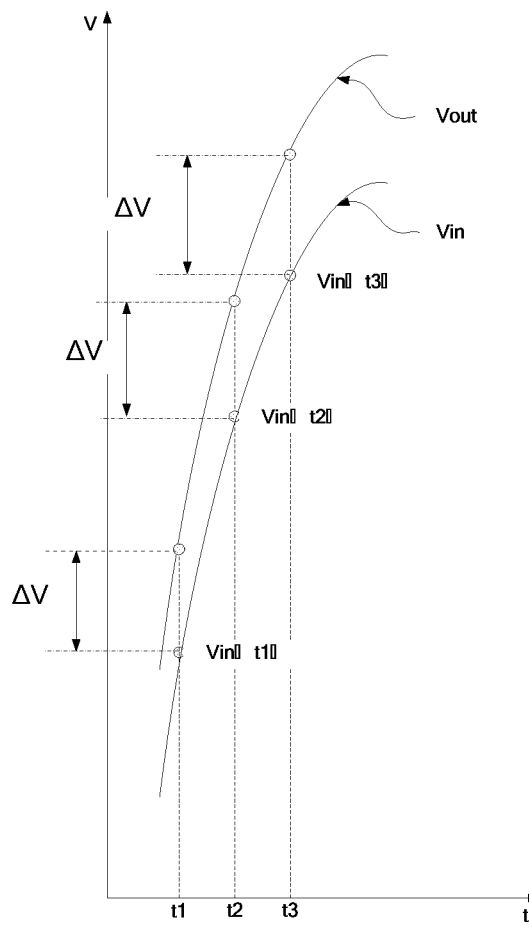
FIG. 3A illustrates a comparison between an input voltage and an output voltage of a voltage bias circuit according to some exemplary embodiments of the present disclosure.

As an example, the bias may be a positive bias (the bias voltage $\Delta V$ is a positive voltage), for example, the output voltage $V_{out}$ is higher than the input voltage Vin n by $\Delta V$, that is, $V_{out}=V_{in}+\Delta V$. The bias may also be a negative bias (the bias voltage $\Delta V$ is a negative voltage), for example, the output voltage $V_{out}$ is lower than the input voltage $V_{in}$ by $\Delta V$, that is, $V_{out}=V_{in}-\Delta V$. For ease of description, in the following description of the present disclosure, $V_{out}=V_{in}+\Delta V$ is taken as an example to illustrate the working mechanism of the rising edge detection circuit. As an example, FIG. 3A illustrates a comparison between the input voltage $V_{in}$ and the output voltage $V_{out}$ of the voltage bias circuit 110 according to some exemplary embodiments of the present disclosure. Referring to FIG. 3A, the input voltage $V_{in}$ rises along the rising edge, and the voltage bias circuit 110 adds the bias voltage $\Delta V$ to $V_{in}$ to generate $V_{out}$.

It should be noted that FIG. 3A exemplarily describes the working process of the voltage bias circuit 110 by taking the rising edge as an example, and the mechanism is the same for the falling edge.

Referring to FIG. 1, the step voltage generating circuit 500 may convert a voltage input to the step voltage generating circuit into a step voltage. For example, the step voltage generating circuit 500 may include a switch circuit 120, a clock circuit 300 and a voltage holding circuit 130. As an example, the switch circuit 120 may include at least one field-effect transistor (FET). As an example, the FET may include, but is not limited to, a metal oxide semiconductor field-effect transistor (MOSFET), a bipolar junction transistor (BJT), a silicon controlled rectifier (SCR), a gate turn-off thyristor (GTO), an insulated gate bipolar transistor (IGBT), a MOS-controlled thyristor (MCT), or a static induction transistor (SIT). The clock circuit 300 is connected to the switch circuit 120 and controls the switch circuit 120 to be disconnected and connected according to the clock period $T_{sample}$ to generate the second voltage $V_2$. The voltage holding circuit 130 is connected to the switch circuit 120 and holds the second voltage $V_2$ after the switch circuit 120 is disconnected, such that the second voltage does not drop by more than the first amplitude in the clock period $T_{sample}$. In this way, the second voltage $V_2$ applied to the second comparator input terminal 220 remains substantially constant during the clock period $T_{sample}$. As an example, the voltage holding circuit 130 may include at least one capacitor circuit.

As mentioned above, the first voltage $V_1$ is different from the second voltage $V_2$ by the bias voltage $\Delta V$ at the beginning of the preset clock period $T_{sample}$, and the second voltage does not drop by more than the first amplitude in the clock period $T_{sample}$.

The working mechanism of the AC/DC voltage detection circuit 001 will be described below.

For ease of description, in the following description of the present disclosure, a "first circuit S1" denotes a circuit connecting the input terminal 101 and the first output terminal 102 of the voltage adjustment circuit, and a "second circuit S2" denotes a circuit connecting the input terminal 101 and the second output terminal 103 of the voltage adjustment circuit. The operating voltage signal $V_0$ may be transmitted to the first comparator input terminal 210 and the second comparator input terminal 220 via the first circuit S1 and the second circuit S2, respectively. Referring to FIG. 1, an input terminal of the first circuit S1 is electrically connected to the operating voltage $V_0$, and an output terminal thereof is the first output terminal 102 of the voltage adjustment circuit. The first circuit S1 may convert the operating voltage $V_0$ into the first voltage $V_1$. An input terminal of the second circuit S2 is electrically connected to the operating voltage $V_0$, and an output terminal thereof is the second output terminal 103 of the voltage adjustment circuit. The second circuit S1 may convert the operating voltage $V_0$ into the second voltage $V_2$.

Referring to FIG. 1, the voltage divider circuit 400 divides the input signal $V_{HV}$ into the operating voltage $V_0$. The operating voltage $V_0$ is then input to the adjustment circuit 100 from the input terminal 101 of the adjustment circuit. The adjustment circuit 100 adjusts the operating voltage $V_0$ to the first voltage $V_1$ and the second voltage $V_2$, which are respectively output from the first output terminal 102 and the second output terminal 103 of the adjustment circuit. The first comparator input terminal 210 is a positive terminal, and the second comparator input terminal 220 is a negative terminal. The first comparator input terminal 210 of the comparator is connected to the first output terminal 102 of the adjustment circuit and receives the first voltage $V_1$, and the second comparator input terminal 220 of the comparator is connected to the second output terminal 103 of the adjustment circuit and receives the second voltage $V_2$.

The first output terminal 102 of the voltage adjustment circuit 100 is electrically connected to the input terminal 101 thereof. For example, as shown in FIG. 1, two ends of the first circuit S1 may be directly connected to the output terminal 420 of the voltage divider circuit 400 and the first comparator input terminal 210 of the comparator. Therefore, the first voltage $V_1$ delivered to the first comparator input terminal 210 of the comparator via the first circuit S1 is equivalent to the operating voltage $V_0$ output from the output terminal of the voltage divider circuit 400, that is, $V_1=V_0$.

The voltage bias circuit 110 is connected in series with the step voltage generating circuit 500, and the circuits in series are respectively connected to the input terminal 101 and the second output terminal 103 of the voltage adjustment circuit. For example, as shown in FIG. 1, the voltage bias circuit 110 and the step voltage generating circuit 500 may be connected in series and arranged on the second circuit S2. The input terminal of the voltage bias circuit 110 may be electrically connected to the output terminal 420 of the voltage divider circuit 400. The voltage bias circuit 110 may add the bias voltage to the operating voltage $V_0$. The voltage bias circuit 110 is configured to bias the operating voltage $V_0$ by $\Delta V$. In other words, the voltage bias circuit 110 may add the bias voltage $\Delta V$ to the operating voltage $V_0$. The bias voltage shown in FIG. 1 is a positive voltage.

The clock circuit 300 is connected to the switch circuit 120. The clock circuit 300 sends out a clock pulse based on the preset clock period $T_{sample}$ to control the on and off of the switch circuit 120.

One terminal of the switch circuit 120 is connected to the output terminal of the voltage bias circuit 110, and the other terminal thereof is used as the output terminal of the voltage adjustment circuit 100 and connected to the second comparator input terminal 220. When the switch circuit 120 is turned on, the second voltage $V_2$ output from the output terminal of the voltage bias circuit 110 may be connected to the second comparator input terminal 220. When the switch circuit 120 is turned off, the second voltage V2 cannot be connected to the second comparator input terminal 220. As an example, the switch circuit 120 may include at least one FET or other circuit that may be controlled to turn on and off a power supply.

One terminal of the voltage holding circuit 130 is grounded (GND), and the other terminal thereof is connected to the second circuit S2 between the switch circuit 120 and the second comparator input terminal 220. The voltage holding circuit 130 is used to stabilize the second voltage V2, which is previously applied to the second comparator input terminal 220 when the switch circuit 120 is connected, within a preset range in the preset clock period after the switch circuit 120 is disconnected. As an example, the voltage holding circuit 130 includes at least one capacitor circuit. For example, in FIG. 1, the voltage holding circuit 130 includes a capacitor $C_{hold}$. When the switch circuit 120 is in a connected state, the second circuit S2 is connected to apply the second voltage $V_2$ to the second comparator input terminal 220, and the capacitor $C_{hold}$ is charged to the second voltage $V_2$. When the switch circuit is in a disconnected state, the voltage $V_2$ of the capacitor $C_{hold}$ is applied to the second comparator input terminal 220 as an input signal of the second comparator input terminal 220, such that the input signal of the second comparator input terminal 220 may be stabilized at the second voltage $V_2$.

Figure 3B:
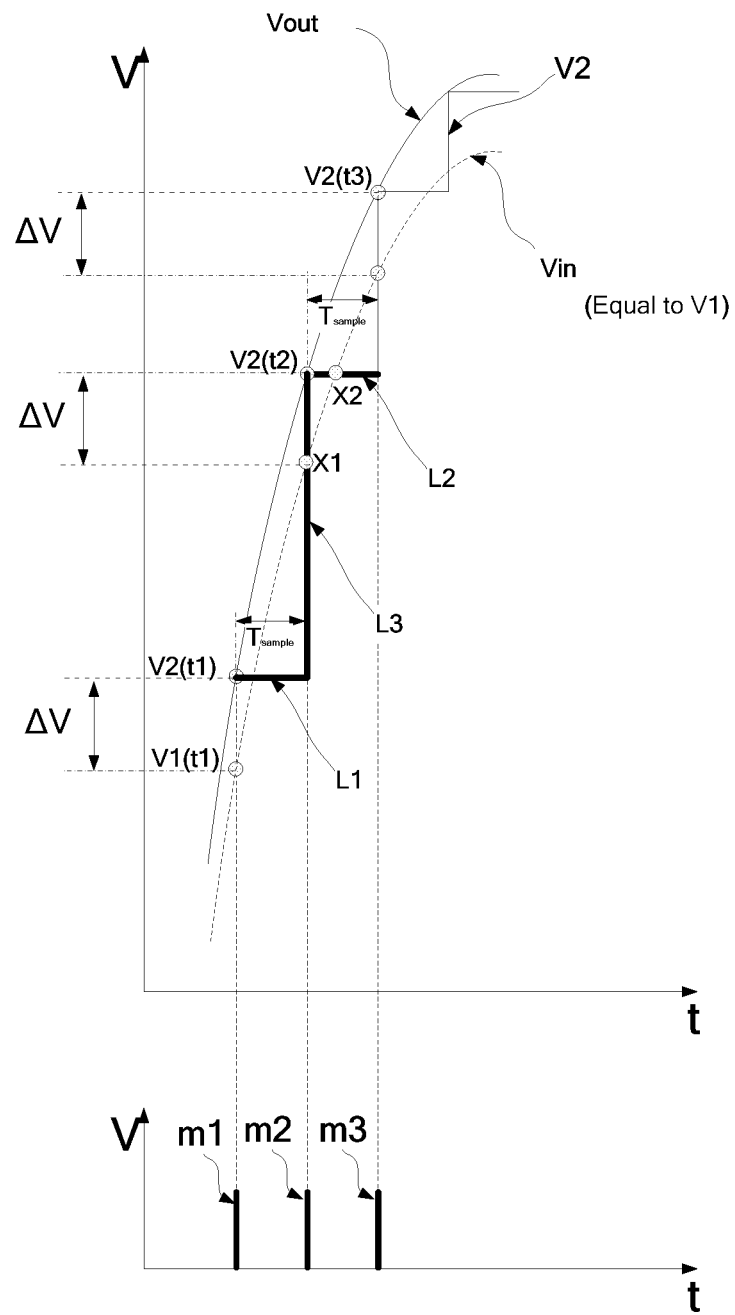
FIG. 3B illustrates a comparison between a voltage on an output terminal of the voltage bias circuit and a second voltage applied to a second input terminal of a comparator according to some exemplary embodiments of the present disclosure.

As an example, FIG. 3B illustrates a comparison between the voltage $V_{out}$ of the output terminal of the voltage bias circuit and the second voltage $V_2$ applied to the second comparator input terminal 220 of the comparator according to some exemplary embodiments of the present disclosure ($\Delta V>0$). FIG. 3B also shows a timing diagram of the voltage $V_{in}$ at the input terminal of the voltage bias circuit with a dotted line.

A pulse signal $m_1$ occurs at time $t_1$. At this time, the voltage at the first comparator input terminal 210 is $V_1(t_1)$. When the pulse signal $m_1$ arrives, the switch circuit 120 is connected, and the voltage at the second comparator input terminal 220 is $V_2(t_1)=V_1(t_1)+\Delta V$. When the switch circuit 120 is connected, the capacitor $C_{hold}$ is charged, such that the voltage across positive and negative terminals of the capacitor $C_{hold}$ becomes $V_2(t_1)$. After the pulse signal $m_1$ ends, the switch circuit 120 is disconnected. The voltage stabilizing effect of the capacitor $C_{hold}$ causes the second voltage at the second comparator input terminal 220 to basically stabilize at $V_2(t_1)$. The stabilization time is a clock period $T_{sample}$ of the pulse signal, which is indicated by a horizontal line L1 in FIG. 3B. As mentioned above, the "basically stabilize" means that the voltage stabilizing effect of the capacitor $C_{hold}$ allows the second voltage at the second comparator input terminal 220 to slightly drop on the basis of $V_2(t_1)$. Such a drop does not exceed the first amplitude, for example, the first amplitude may be 1%, 2%, 3%, 4%, 5%, 6%, 7%, 8%, 9% or 10% of $\Delta V(t_1)$, or it may be in an interval between any two of these numbers.

A pulse signal $m_2$ occurs at time $t_2$. When the pulse signal $m_2$ arrives, the voltage at the first comparator input terminal 210 is $V_1(t_2)$. The switch circuit 120 is connected again, and the voltage at the second comparator input terminal 220 increases instantaneously from $V_2(t_1)$ to the voltage at the output terminal of the voltage bias circuit, that is, $V_2(t_2)=V_1(t_2)+\Delta V(t_2)$. When the switch circuit 120 is connected, the capacitor $C_{hold}$ is charged, such that the voltage across positive and negative terminals of the capacitor $C_{hold}$ becomes $V_2(t_2)$. After the pulse signal $m_2$ ends, the switch circuit 120 is disconnected. The voltage stabilizing effect of the capacitor $C_{hold}$ causes the second voltage at the second comparator input terminal 220 of the comparator to basically stabilize at $V_2(t_2)$. The stabilization time is a clock period $T_{sample}$ of the pulse signal, which is indicated by the horizontal line L2 in FIG. 3B. As mentioned above, the "basically stabilize" means that the voltage stabilizing effect of the capacitor $C_{hold}$ allows the second voltage at the second comparator input terminal 220 of the comparator to slightly drop on the basis of $V_2(t_2)$. Such a drop does not exceed the first amplitude, for example, the first amplitude may be 1%, 2%, 3%, 4%, 5%, 6%, 7%, 8%, 9% or 10% of $\Delta V(t_2)$, or it may be in an interval between any two of these numbers.

The timing of the voltage $V_2$ applied to the second comparator input terminal 220 of the comparator is shown in FIG. 3B. Since the magnitude of the first voltage $V_1$ is equivalent to that of $V_{in}$, the relationship between the first voltage $V_1$ and the second voltage $V_2$ can be obtained. As an example, FIG. 3B also shows the timing of the first voltage $V_1$ applied to the first input terminal 220 of the comparator and the second voltage $V_2$ applied to the second comparator input terminal 220 of the comparator according to some exemplary embodiments of the present disclosure.

Referring to FIG. 3B, the switch circuit 120 receives the pulse signal $m_2$ of the clock circuit 300 at time $t_2$. The pulse signal $m_2$ causes the second voltage to increase from $V_2(t_1)$ to $V_2(t_2)$, which is indicated by a vertical line L3 in FIG. 3B. $V_2$ and $V_1$ cross at a cross point X1. The time corresponding to X1 is $t_2$. Before time $t_2$, the first voltage is above the second voltage, that is, the first voltage is higher than the second voltage. After time $t_2$, the first voltage is below the second voltage, that is, the first voltage is lower than the second voltage. The first voltage $V_1$ is applied to the first input terminal of the comparator, and the second voltage $V_2$ is applied to the second input terminal of the comparator. Therefore, before the clock signal $m_2$ arrives, the first voltage is higher than the second voltage, and the comparator output terminal 230 of the comparator 200 outputs a high level. After the clock signal $m_2$ ends, the first voltage is lower than the second voltage, and the comparator output terminal 230 of the comparator 200 outputs a low level. That is, when the clock signal $m_2$ arrives, the comparator flips from a high level to a low level. Therefore, the clock signal $m_2$ can cause the comparator to flip once.

Referring to FIG. 3B, as described above, the second voltage V2 is maintained at $V_2(t_2)$ (indicated by the horizontal line L2) in a duration from the end of the pulse signal $m_2$ to the arrival of a pulse signal $m_3$ (that is, a $t_2$-$t_3$ interval in FIG. 3B). In this duration, the first voltage $V_1$ continuously climbs from the cross point $X_1$. The first voltage and the second voltage cross again at point $X_2$. The time corresponding to the cross point $X_2$ is $t_{x2}$. That is, at $t_{x2}$, the comparator flips again. As described above, at the time corresponding to the cross point $X_1$, the output of the comparator flips from high to low (that is, a falling edge occurs). At the time corresponding to the cross point $X_2$, the output of the comparator is flipped from low to high (that is, a rising edge occurs). At the time $t_3$ when the next pulse signal $m_3$ arrives, the output of the comparator is flipped from high to low again (that is, a falling edge occurs again).

The second voltage $V_2$ is lower than the first voltage $V_1$ at the beginning of the clock period $T_{sample}$. In a clock period $T_{sample}$, when the rising amplitude of the operating voltage $V_0$ exceeds the bias voltage, the output of the comparator 200 undergoes at least one flip between the high and low levels.

It should be noted that the premise of the above-mentioned flip is that at the beginning of the clock period $T_{sample}$, $\Delta V$ causes the step voltage $V_2$ to be higher than the voltage $V_1$ that naturally fluctuates with $V_0$. The fluctuation interval of the voltage $V_1$ in one clock period $T_{sample}$ is higher than $\Delta V$, such that $V_1$ cross with $V_2$. Under this condition, every time a pulse signal arrives, the output of the comparator is flipped from high to low (that is, a falling edge occurs). The output of the comparator between two pulse signals is flipped from low to high (that is, a rising edge occurs). When the next pulse signal arrives, the output of the comparator is flipped from high to low again (that is, a falling edge occurs again).

As described above, when the input signal $V_{HV}$ shown in FIG. 2A is an AC signal and $V_{HV}$ is at the falling edge, the first voltage $V_1$ drops with time, and it is lower than the second voltage $V_2$ at the beginning of the $V_1$ clock period. Therefore, the second voltage $V_2$ is always higher than the first voltage $V_1$, and the output terminal of the comparator 200 always outputs a low level, and thus no flip occurs.

In summary, when $V_{HV}$ is at the rising edge, the output of the comparator may be flipped, that is, the comparator may output a pulse. When $V_{HV}$ is at the falling edge, the output of the comparator is not flipped, that is, the comparator does not output a pulse.

Therefore, by detecting whether the comparator can output a pulse by the detection and output circuit 700, it can be known whether the $V_{HV}$ is currently at a rising edge or a falling edge.

In summary, the AC/DC voltage detection circuit provided by the present disclosure adds a bias to the operating voltage $V_0$ through the voltage bias circuit 110 in the voltage adjustment circuit 100. The bias is stored in the capacitor $C_{hold}$ when a switch is turned on. The bias signal is sampled and held by the switch downstream of the voltage bias circuit 110, the clock signal and the capacitor $C_{hold}$. Slopes of the first voltage signal (direct sample) applied to the first input terminal of the comparator and the second voltage applied to the second input terminal of the comparator are different, such that a crossing occurs in the clock period. The output of the comparator is flipped every time a crossing occurs. By determining whether the comparator can output a pulse signal, the characteristic of the input electrical signal can be determined, for example, whether the input signal fluctuates, or whether the input signal is at a rising edge or a falling edge.

In some exemplary embodiments, the IC is only allowed to operate at the rising edge of the AC, rather than at the falling edge of the AC. To determine the time to stop the IC, the detection circuit needs to detect when the input signal changes from a rising edge to a falling edge. The input signal $V_{HV}$ changes from a rising edge to a falling edge at a peak 901. Therefore, if the position of the peak 901 can be accurately detected, the time of the change from the rising edge to the falling edge can be known.

The detection circuit 001 provided by the present disclosure can determine the change from the rising edge to the falling edge according to the last cross point of $V_1$ and $V_2$.

Referring to FIG. 2A, when $V_1$ approaches the peak 901, the slope of $V_1$ gradually decreases. As the clock runs, the slope of $V_1$ gradually decreases to zero and continues to decrease to a negative value. At the end of the rising edge, as the slope of $V_1$ gradually decreases, the first voltage and the second voltage no longer cross, and the output of the comparator is no longer flipped. That is, the comparator no longer continuously outputs a pulse.

Figure 2B:
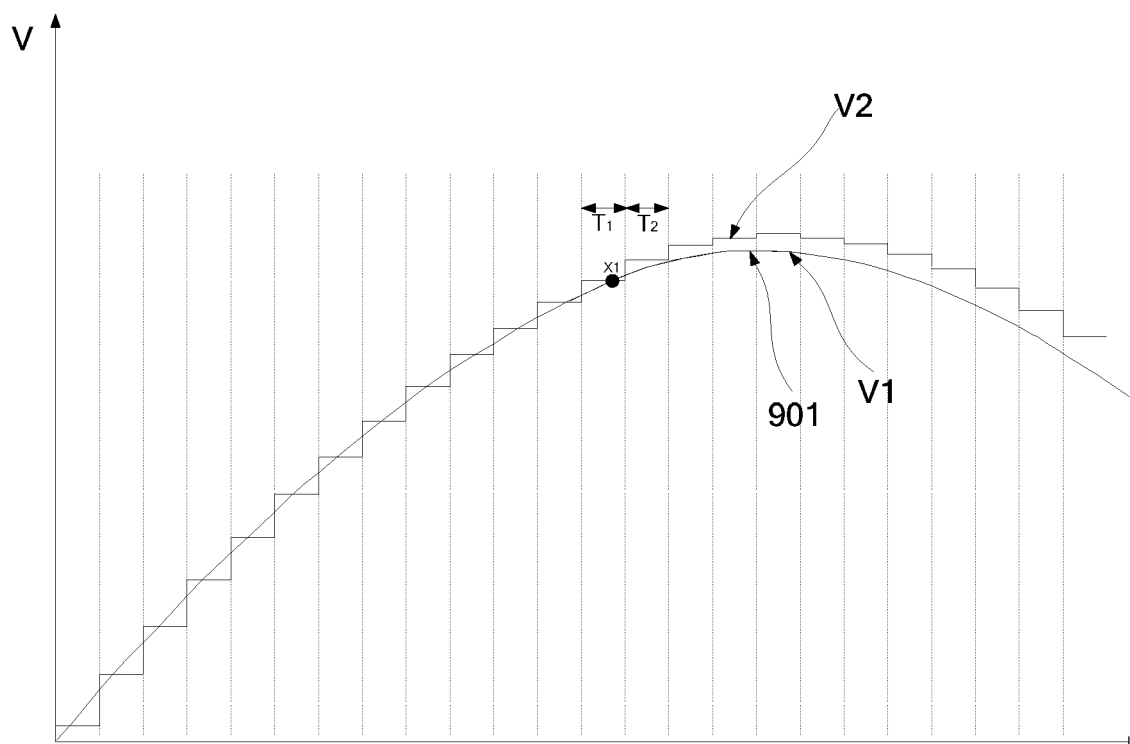
FIG. 2B illustrates a timing diagram of $V_1$ and $V_2$ according to some exemplary embodiments of the present disclosure.
Figure 2C:
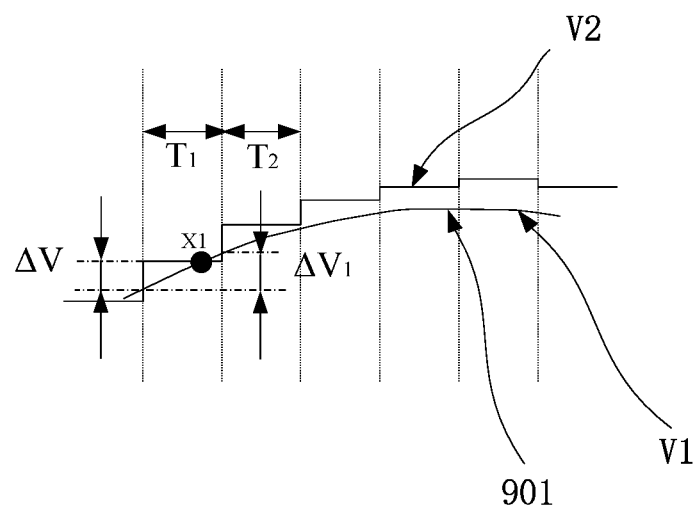
FIG. 2C is an enlarged view of curves of $V_1$ and $V_2$ in a clock period $T_1$ in FIG. 2B.
Figure 2D:
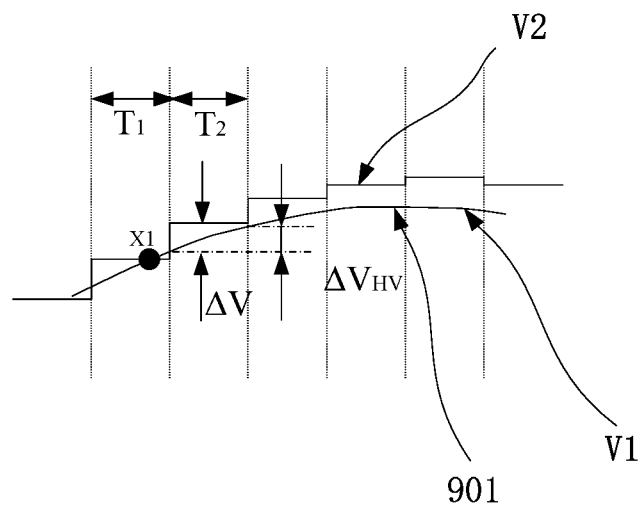
FIG. 2D is an enlarged view of curves of $V_1$ and $V_2$ in a clock period $T_2$ in FIG. 2B.

As an example, FIG. 2B illustrates a timing diagram of $V_1$ and $V_2$ according to some exemplary embodiments of the present disclosure; FIG. 2C is an enlarged view of curves of $V_1$ and $V_2$ in a clock period $T_1$ in FIG. 2B; FIG. 2D is an enlarged view of curves of $V_1$ and $V_2$ in a clock period $T_2$ in FIG. 2B. In the clock period $T_1$, $V_1$ and $V_2$ cross at the cross point $X_1$, which is the last cross point of $V_1$ and $V_2$ at the rising edge. In the clock period $T_2$ immediately following the clock period $T_1$ and at the rising edge thereafter, $V_1$ and $V_2$ no longer cross.

Referring to FIG. 2C and FIG. 2D, in the clock period $T_1$, the change $\Delta V_1$ of $V_1$ is higher than the bias voltage $\Delta V$, and therefore, $V_1$ and $V_2$ cross. In the clock period $T_2$, the change $\Delta V_1$ of $V_1$ is lower than the bias voltage $\Delta V$, and therefore, $V_1$ and $V_2$ do not cross.

That is, in one clock period $T_{sample}$, when the change of the operating voltage is greater than the bias voltage, $V_1$ and $V_2$ cross, and the output signal of the output terminal has at least one target flip between the high and low levels.

When the input signal rises along the rising edge, the slope of the input signal gradually decreases. Therefore, in one clock period, the change of the input signal gradually decreases until it reaches zero. The slope of the input signal at the position of the peak 901 is zero.

As described above, when the change in the operating voltage is greater than the bias voltage, $V_1$ and $V_2$ cross, and when the change in the operating voltage is less than the bias voltage, $V_1$ and $V_2$ do not cross. When the input signal rises along the rising edge, the change of the input signal gradually decreases to become zero. Since the magnitude of the bias voltage is not zero, before reaching the peak 901, $V_1$ and $V_2$ gradually change from "crossing" to "non-crossing". Therefore, there must be a last cross point.

The position of the peak 901 can be determined according to the position of the last cross point, that is, the position of the peak 901 can be determined according to the last target flip event of the comparator.

In the duration of a rising edge, the last pulse output by the comparator corresponds to the last crossing of $V_1$ and $V_2$, that is, the time when the comparator stops outputting a pulse corresponds to the last crossing.

In summary, the circuit provided by the present disclosure can determine the change from the rising edge to the falling edge based on the time when the comparator stops outputting a pulse. The determination accuracy increases as the time of stopping the pulse output (that is, the time of the last cross point) approaches the peak.

Figure 2E:
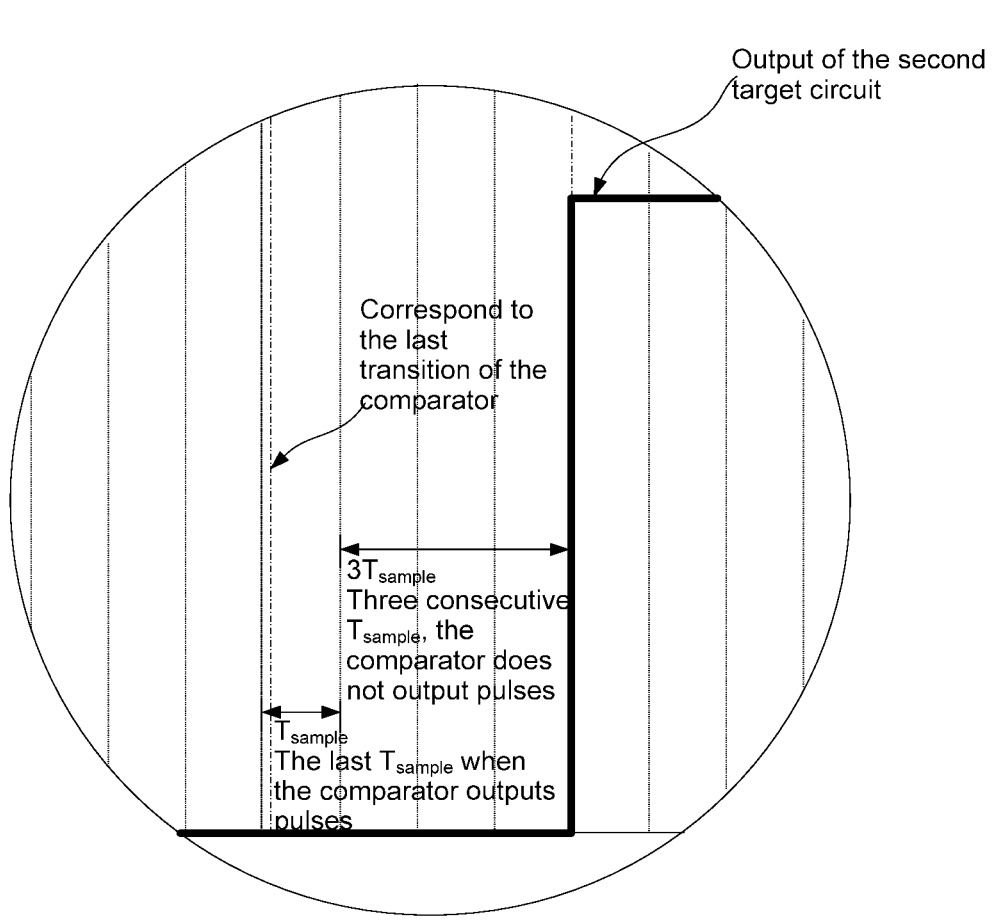
FIG. 2E is a detailed view of a region A in FIG. 2A according to the present disclosure.

As an example, FIG. 2E is a detailed view of a region A in FIG. 2A according to the present disclosure. Referring to FIG. 2E, when the comparator no longer outputs a pulse, a second target circuit may be triggered to monitor the output of the comparator. When the comparator starts continuous pulse output again, the second target circuit may be reset to indicate that a rising edge occurs again. In this way, the current state of the input signal $V_{HV}$ (either at a rising edge or at a falling edge) may be determined based on the output of the second target circuit. As an example, the second target circuit may be a monitoring circuit. As an example, the monitoring circuit may include a power-on prohibition unit or a switch signal prohibition unit. In some exemplary embodiments, the power-on prohibition unit may include a hardware-based power-on prohibition circuit, and the switch signal prohibition unit may include a hardware-based switch signal prohibition circuit. In some exemplary embodiments, the monitoring circuit may also be implemented by a software-controlled general-purpose circuit, for example, the general-purpose control circuit may be controlled by a power-on prohibition program or a switch signal prohibition program to complete the function of the power-on prohibition circuit or the switch signal prohibition circuit.

Based on the previous analysis, at the rising edge, the position of the last cross point of $V_1$ and $V_2$ is related to the detection accuracy of the detection circuit. The detection accuracy increases when the last cross point approaches a true peak. By selecting the appropriate bias voltage and clock period, the last cross point can be close to the true peak. In practice, the last cross point is more or less offset from the true peak. Therefore, the sampling of the circuit may more or less miss the actual peak.

In some exemplary embodiments, the power-on prohibition unit or the switch signal prohibition unit may be configured to be activated once it is detected that the comparator does not output a pulse.

Referring to FIG. 2E, the rising edge and the falling edge change at the peak 901. Before the change, it is a rising edge, and after the change, it is a falling edge. Assuming that the clock time corresponding to the peak 901 is $t_p$, in one or more clock periods before the time $t_p$, the first voltage and the second voltage no longer cross, and the comparator no longer outputs a pulse.

In order to improve the detection accuracy and ensure that the second target circuit starts at a falling edge, the detection and output circuit 700 may be configured as follows. When a detection result of the detection circuit shows that the comparator does not undergo the target flip in n consecutive clock periods $T_{sample}$, the detection circuit outputs a second signal to trigger the second target circuit, the n being a natural number not less than 2. That is, when the comparator does not undergo the target flip within n consecutive clock periods, the detection and output circuit generates the second signal to indicate that the operating voltage changes from a rising edge to a falling edge, the n being a natural number not less than 2. For example, the n may be 2, 3, 4, 5, 6, 7, 8, 9 or 10, etc.

Based on the previous description, the position of the last cross point of $V_1$ and $V_2$ is related to many factors. As an example, the factors that affect the position of the last cross point of $V_1$ and $V_2$ include, but are not limited to, the magnitude of the bias voltage, the sampling frequency of the clock pulse, and the frequency and peak of the input signal. Therefore, the value of n is also related to the above factors. In a practical application, the value of n may be determined according to the magnitude of the bias voltage, the sampling frequency of the clock pulse, the frequency and peak of the input signal and the detection accuracy. In practice, the value of n in the range of 1 to 3 can enable the circuit to maintain high detection accuracy. In other words, in practice, in order to improve the detection accuracy, the time when the second target circuit is triggered may be delayed by 1 to 3 sampling periods $T_{sample}$ from the time of the last pulse output by the comparator.

Referring to FIG. 2A, the time of triggering the second target circuit is delayed by 3 clock periods $T_{sample}$ from the time when the comparator stops pulse output, such that the second target circuit is triggered at a falling edge. This increases the accuracy of triggering the second target circuit at a falling edge. If the second target circuit is triggered corresponding to the time of stopping the IC, the time of stopping the IC is at a falling edge and is not far from the actual peak position, which improves the detection accuracy of the circuit.

In addition to the time of stopping the IC, the detection and output circuit 700 may also determine the time of starting the IC based on the output of the comparator. Taking a switching power supply controller as an example, the switching power supply controller needs to detect an AC line voltage and determine when the AC line voltage is high enough to start the operation of the IC. When the AC line voltage is too low, the switching power supply controller must stop the switching operation so as to protect the system from excessive voltages during operation.

A start threshold $V_{HV}(start)$ refers to a preset condition that must be met to start the operation of the IC. When the input voltage $V_{HV}$ input to the circuit 001 via the HV pin is higher than the start threshold $V_{HV}(start)$, the operation of the IC is started.

In some exemplary embodiments, $V_{HV}$ may have a spike at a rising edge. Some spike may cause the input voltage $V_{HV}$ to exceed the start threshold $V_{HV}(start)$ in a short time. After the spike passes, the input voltage $V_{HV}$ may return to below the start threshold $V_{HV}(start)$ (that is, lower than the start threshold). In this case, if the IC is configured to be started immediately once it is detected that the input voltage $V_{HV}$ exceeds the start threshold $V_{HV}(start)$, a false start will occur. Therefore, in some exemplary embodiments of the present disclosure, the detection and output circuit 700 may be configured as follows. When a detection result of the detection and output circuit 700 shows that the comparison results all indicate that the target flips occur in N consecutive clock periods $T_{sample}$ and the operating voltage $V_{HV}$ is not lower than the start threshold $V_{HV}(start)$ when each of the target flips occurring in the N consecutive clock periods occurs, the detection and output circuit 700 may output a first signal to start the IC, the N being a natural number not less than 2. For example, the N may be 2, 3, 4, 5, 6, 7, 8, 9 or 10, etc. As an example, the first signal may be configured to control the start of a first target circuit. As an example, the first target circuit may include an IC. As an example, the IC may include a flyback converter.

That is, according to the circuit provided by the present disclosure, the IC is started only when the following two conditions are met at the same time.

Condition 1: The comparison results output by the comparator 200 in the N consecutive clock periods $T_{sample}$ respectively include a target flip.

Condition 2: The operating voltage $V_{HV}$ is not lower than the start threshold $V_{HV}(start)$ when each of the target flips occurring in the N consecutive clock periods occurs.

For ease of understanding, in the following description of the present disclosure, N=2 is taken as an example to describe the circuit.

Figure 2F:
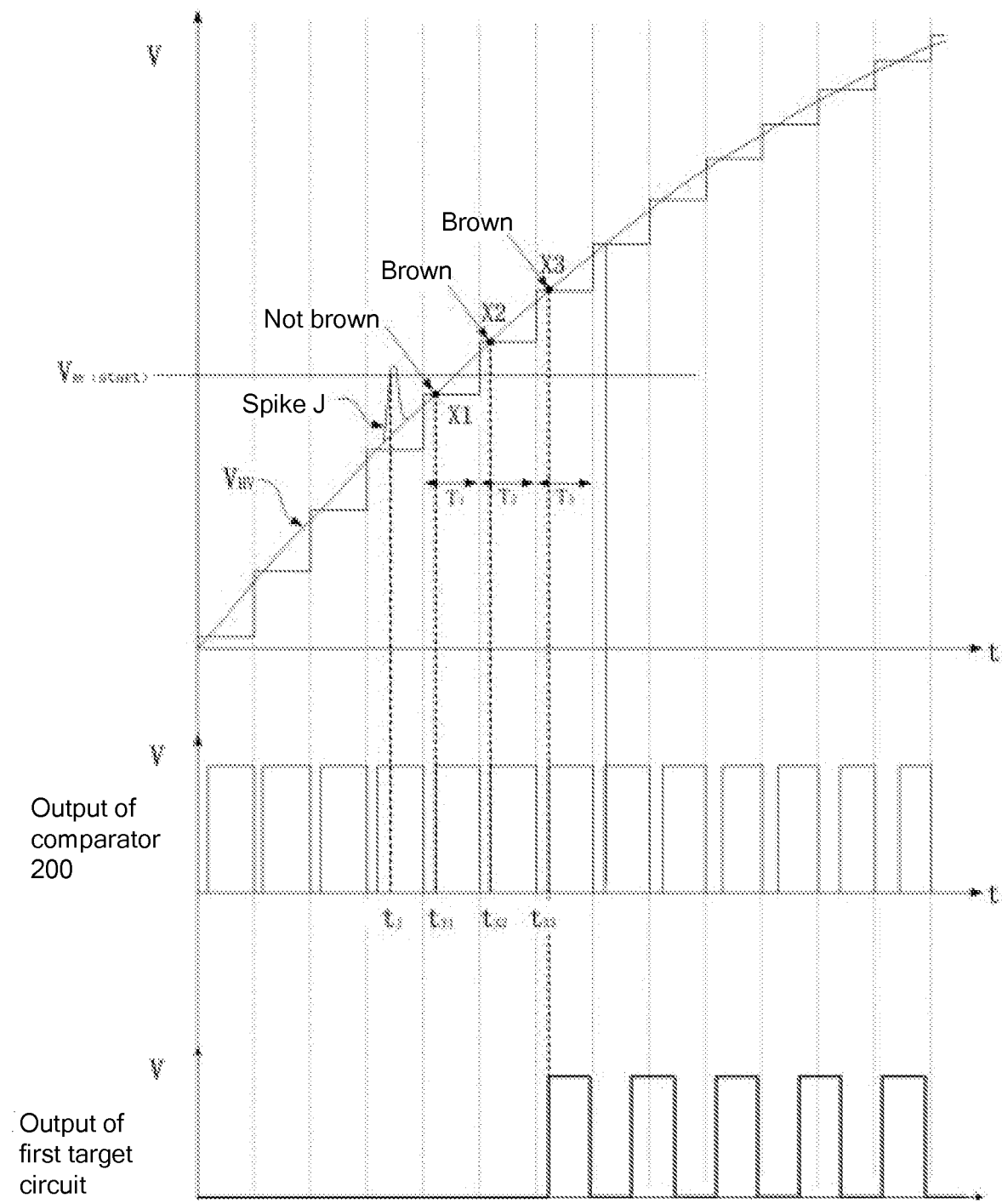
FIG. 2F illustrates a timing diagram of various signals of an AC/DC voltage detection circuit in operation according to some exemplary embodiments of the present disclosure.

As an example, FIG. 2F illustrates a timing diagram of various signals of another AC/DC voltage detection circuit in operation according to some exemplary embodiments of the present disclosure. Referring to FIG. 2F, a spike J in $V_{HV}$ causes $V_{HV}$ to exceed $V_{HV}(\text{start})$ at time tj, and after the spike J goes away, $V_{HV}$ returns to below $V_{HV}(\text{start})$. If the IC is started immediately once it is detected that the input voltage $V_{HV}$ exceeds the start threshold $V_{HV}(\text{start})$, that is, the IC is started at $t_f$, a false start will occur.

As discussed above, the circuit provided by the present disclosure can only start the IC when Condition 1 and Condition 2 are met at the same time. Taking N=2 as an example, it can be understood that, in order to avoid a false start, the IC must sample two consecutive AC line voltages which are higher than the start threshold before the start operation.

Specifically, in FIG. 2F, the spike J enables $V_{HV}$ to exceed the start threshold $V_{HV}(\text{start})$ at time $t_f$. The output results of the comparator have a target flip in two consecutive clock periods (the clock periods $T_1$ and $T_2$) since the $V_{HV}$ exceeding the start threshold $V_{HV}(\text{start})$. Based on the above description, the target flip in the clock period $T_1$ corresponds to the time when the cross point X1 appears, and the target flip in the clock period $T_2$ corresponds to the time when the cross point X2 appears. Referring to FIG. 2F, $V_{HV}$ is lower than $V_{HV}(\text{start})$ at the time $t_{X1}$ when the cross point X1 appears, and $V_{HV}$ is higher than $V_{HV}(\text{start})$ at the time $t_{X2}$ when the cross point X2 appears.

In other words, Condition 1 is met, that is, in the two clock periods (the clock periods $T_1$ and $T_2$) since the $V_{HV}$ exceeds the start threshold $V_{HV}(\text{start})$, the output results of the comparator respectively undergo a target flip. However, Condition 2 is not met, that is, when the first target flip of the two target flip occurs, the corresponding $V_{HV}$ is lower than $V_{HV}(\text{start})$. Therefore, the IC cannot be started. In this way, a false start is avoided.

In the two consecutive clock periods $T_2$ and $T_3$, the output results of the comparator in the two consecutive clock periods have a target flip. According to the above discussion, in the two consecutive clock periods of $T_2$ and $T_3$, the first target flip corresponds to the time of the cross point X2, and the second target flip corresponds to the time of the cross point X3. At the time $t_{X2}$ when the cross point X2 appears and the time $t_{X3}$ when the cross point X2 appears, $V_{HV}$ is higher than $V_{HV}(\text{start})$. That is, in the two consecutive clock periods $T_2$ and $T_3$, the input signal $V_{HV}$ meets both Condition 1 and Condition 2. Therefore, the IC can be started. In this way, the accuracy of the circuit is improved.

Figure 2G:
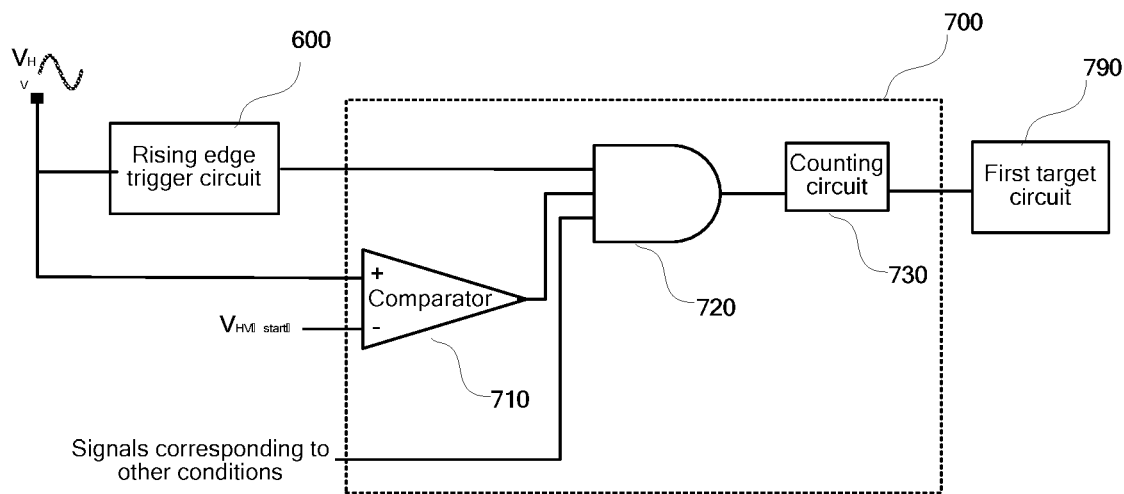
FIG. 2G illustrates a structure of a detection and output circuit according to some exemplary embodiments of the present disclosure.

As an example, FIG. 2G illustrates a structure of the detection and output circuit 700 according to some exemplary embodiments of the present disclosure. Referring to FIG. 2G, the detection and output circuit 700 may include a comparator 710, an AND circuit 720 and a counting circuit 730.

The comparator 710 is configured to compare $V_{HV}$ and $V_{HV}(\text{start})$. When $V_{HV}$ is higher than $V_{HV}(\text{start})$, the comparator 710 outputs a high level, and when $V_{HV}$ is lower than $V_{HV}(\text{start})$, the comparator 710 outputs a low level.

The output terminal of the rising edge trigger circuit 600 is connected to a first input terminal of the AND circuit 720. For the rising edge trigger circuit 600 shown in FIG. 1, the output of the comparator 200 is the output of the rising edge trigger circuit 600. Based on the above description, when the input signal $V_{HV}$ is an AC signal and is at a rising edge, the comparator 200 may output a pulse with a target flip (as shown in FIG. 2F).

Referring to FIG. 2G, an output terminal of the comparator 710 is connected to a second input terminal of the AND circuit 720.

According to the circuit structure shown in FIG. 2G, the timing shown in FIG. 2F and the principle of the AND circuit 720, it can be understood that a pulse output by the comparator 200 is used as a sampling pulse to perform a target sampling on a comparison result of the comparator 710. The time when each sampling pulse in the target sampling occurs corresponds to the time when the target flip occurs, that is, the time when the cross points X1, X2 and X3 shown in FIG. 2F appear. When a sampling result corresponding to a sampling pulse is a high level, it means that the input signal $V_{HV}$ is higher than $V_{HV}(\text{start})$ when the target flip occurs, that is, $V_{HV}$ is higher than $V_{HV}(\text{start})$ when the cross point appears. An output signal of the AND circuit 720 represents a result of this sampling. That is, when the AND circuit 720 outputs a high level, it means that $V_{HV}$ is higher than $V_{HV}(\text{start})$ when the corresponding cross point appears. Conversely, when the AND circuit 720 outputs a low level, it means that $V_{HV}$ is lower than $V_{HV}(\text{start})$ when the corresponding cross point appears.

An input terminal of the counting circuit 730 is connected to the output terminal of the AND circuit 720, and an output terminal of the counting circuit 830 is connected to a first target circuit 790. As an example, the first target circuit 790 is a flyback converter. The counting circuit 730 is configured to count the number of pulses output by the AND circuit 720. If a counting result of the counting circuit 730 shows that the AND circuit 720 respectively outputs a pulse in two consecutive clock periods T, it means that the output of the comparator 200 in the two consecutive clock periods respectively undergoes a target flip, and when the target flip occurs, the corresponding $V_{HV}$ is higher than $V_{HV}(\text{start})$. Therefore, the IC can be started. In summary, a false start can be avoided by sampling two continuous AC line voltages which are higher than the start threshold before starting the IC.

It should be noted that the above only lists the two conditions that must be met to start the IC. In actual applications, there may be other conditions for starting the IC without affecting the core principle of the present disclosure. For example, in the circuit structure shown in FIG. 2G, the input terminal of the AND circuit 720 may also be connected to signals corresponding to other conditions.

In some exemplary embodiments, the magnitude of $\Delta V$ is constant, regardless of the characteristic of the input voltage $V_{in}$.

Figure 4A:
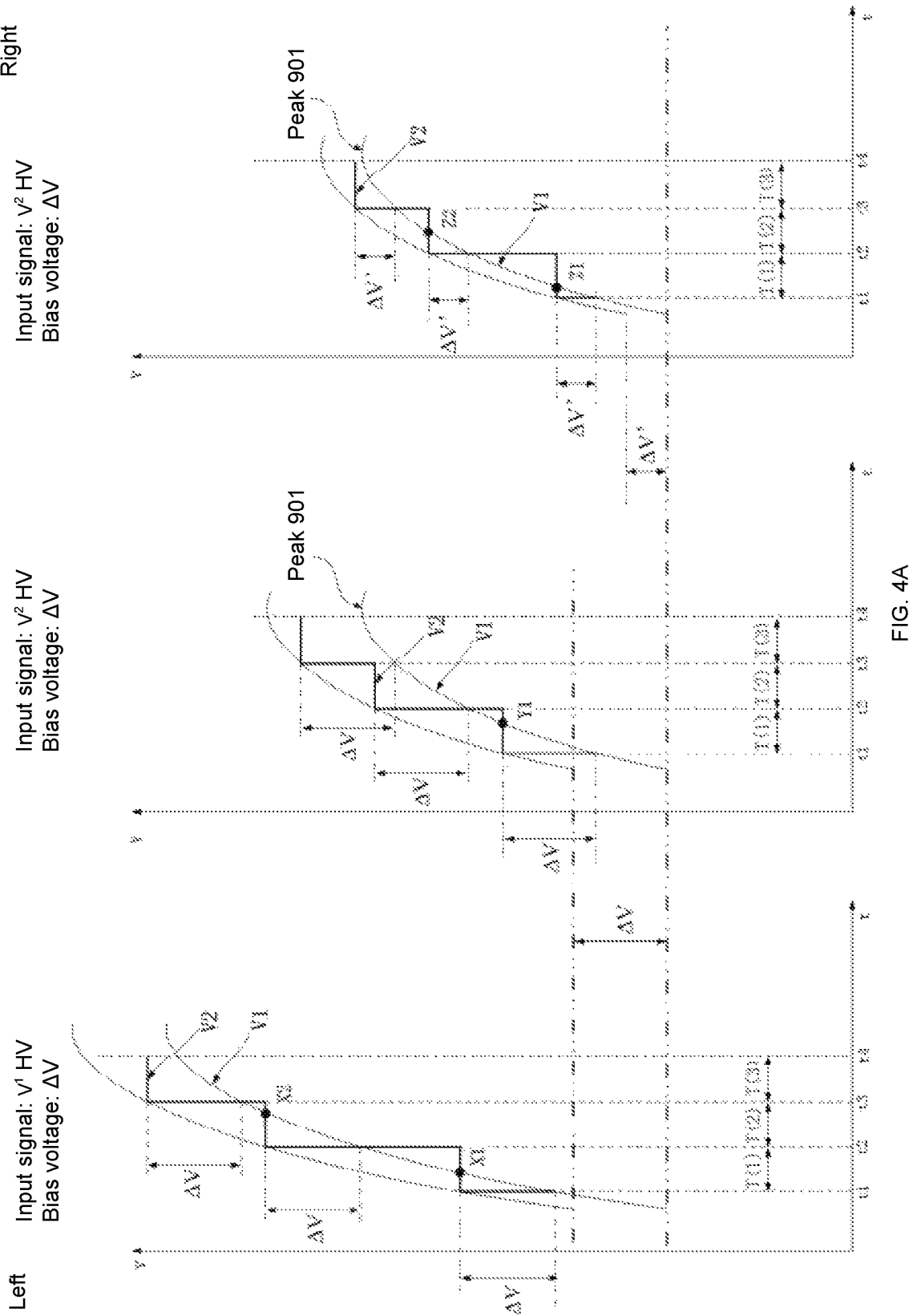
FIG. 4A illustrates a comparison of outputs corresponding to two different inputs $V_{HV}^1$ and $V_{HV}^2$ under a constant $\Delta V$ according to some exemplary embodiments of the present disclosure.

As an example, FIG. 4A illustrates a comparison of outputs corresponding to two different inputs $V_{HV}^1$ and $V_{HV}^2$ under a constant $\Delta V$ according to some exemplary embodiments of the present disclosure.

FIG. 4A shows three diagrams in sequence from left to right. In the three diagrams, the sampling clock period is $T_{sample}$. In the left diagram of FIG. 4A, a corresponding input signal is $V_{HV}^1$, and a corresponding bias voltage is $\Delta V$. In the middle diagram of FIG. 4A, a corresponding input signal is $V_{HV}^2$, and a corresponding bias voltage is $\Delta V$. In the right diagram of FIG. 4A, a corresponding input signal is $V_{HV}^2$, and a corresponding bias voltage is $\Delta V'$. In FIG. 4A, the peak of the signal $V_{HV}^2$, is higher than that of the signal $V_{HV}^1$, and $\Delta V'$ is higher than $\Delta V$.

Referring to the left diagram in FIG. 4A, when the input signal is $V_{HV}^1$, in a clock period T(1), V1 and V2 cross (cross point X1), and the comparator outputs a pulse. In a clock period T(2), V1 and V2 cross (cross point X2), and the comparator outputs a pulse. In a clock period T(3), V1 and V2 do not cross, and the comparator stops outputting a pulse. According to the above description, the detection and output circuit 700 determines whether the input signal $V_{HV}$ is currently at a rising edge or a falling edge by determining whether the comparator can output a pulse. If the detection and output circuit 700 is configured to output a signal indicating a falling edge when a next clock pulse (corresponding to a pulse m4 at t4 in the left diagram of FIG. 4A) arrives after the comparator stops outputting a pulse, then, as shown in the left diagram of FIG. 4A, the detection and output circuit 700 outputs a signal at t4 to indicate that the $V_{HV}$ changes from a rising edge to a falling edge. As an example, if the monitoring circuit is configured to detect the output of the comparator, when the pulse m4 at time t4 arrives, the output of the monitoring circuit undergoes a flip.

Referring to the middle diagram of FIG. 4A, when the input signal is $V_{HV}^2$, V1 and V2 cross (cross point Y1) in the clock period T(1), and the comparator outputs a pulse. Since the clock period T(2), V1 and V2 do not cross, and the comparator stops outputting a pulse. According to the above description, the detection and output circuit 700 determines whether the input signal $V_{HV}$ is currently at a rising edge or a falling edge by determining whether the comparator may output a pulse. Similarly, if the detection and output circuit 700 is configured to output a signal indicating a falling edge when a next clock pulse (corresponding to a pulse m3 at t3 in the middle diagram of FIG. 4A) arrives after the comparator stops outputting a pulse, then, as shown in the middle diagram of FIG. 4A, the detection and output circuit 700 outputs a signal at t3 to indicate that the $V_{HV}$ changes from a rising edge to a falling edge. As an example, if the monitoring circuit is configured to detect the output of the comparator, when the pulse m3 at time t3 arrives, the output of the monitoring circuit undergoes a flip.

The left diagram of FIG. 4A is compared with the middle diagram of FIG. 4A. When the input signal is V, with a small peak, if the same bias voltage ΔV is used, compared with the left diagram of FIG. 4A, the middle diagram of FIG. 4A shows that the time when the monitoring circuit undergoes a flip has a long wavelength band from a peak 901 of $V_{HV}^2$. That is, when the monitoring circuit undergoes a flip, $V_{HV}^2$ actually has a long wavelength band before it changes from a rising edge to a falling edge. This is because when the peak of the input signal $V_{HV}^2$ is small, its initial slope is also small. In this case, if it is determined directly according to the output result of the comparator that the rising edge is ended and the falling edge is started, the detection accuracy of the circuit is not very high.

In some exemplary embodiments, the magnitude of ΔV may be related to $V_{in}$.

Figure 4B:
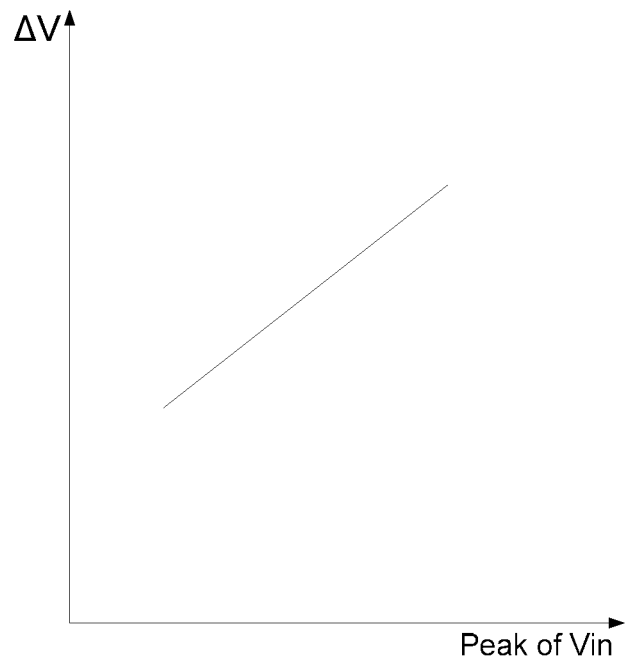
FIG. 4B illustrates a relationship between the $\Delta V$ and a peak of $V_{in}$ according to some exemplary embodiments of the present disclosure.
Figure 4C:
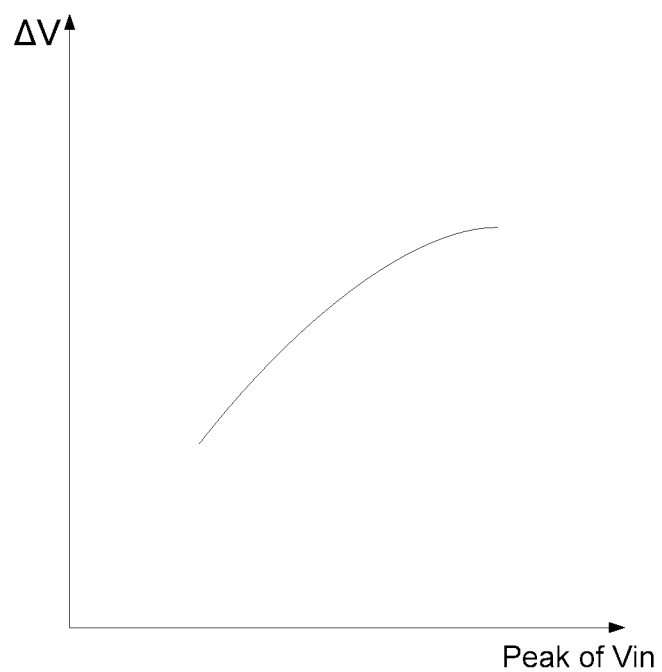
FIG. 4C illustrates a relationship between the $\Delta V$ and the peak of $V_{in}$ according to some exemplary embodiments of the present disclosure.

As an example, the magnitude of ΔV may be positively correlated with the peak of $V_{in}$. That is, if the peak of $V_{HV}^2$ is lower than that of $V_{HV}^1$, then the value of $ΔV_2$ is lower than that of $ΔV_1$. As an example, FIG. 4B illustrates a relationship between ΔV and the peak of $V_{in}$ according to some exemplary embodiments of the present disclosure. In the exemplary embodiments shown in FIG. 4B, ΔV=K·(peak of $V_{in}$), where K is a constant value, that is, ΔV has a linear positive correlation with the peak of V. It should be noted that FIG. 4B is only an example to describe the positive correlation between ΔV and the peak of $V_{HV}$. The positive correlation between ΔV and the peak of $V_{HV}$ may also be non-linear without affecting the core spirit of the present disclosure. For example, FIG. 4C illustrates another relationship between ΔV and the peak of $V_{in}$ according to some exemplary embodiments of the present disclosure. In FIG. 4C, ΔV is positively, but not linearly correlated with the peak of $V_{HV}$. Of course, in some exemplary embodiments, the magnitude of ΔV may also change in real time with $V_{in}$. For example, $ΔV(t)=K·V_{in}(t)$.

Referring to FIG. 4A, as shown in the right diagram of FIG. 4A, when the input signal is $V_{HV}^2$ with a small peak, if a small bias voltage ΔV' is used, in a clock period T(1), V1 and V2 cross (cross point Z1), and the comparator outputs a pulse. In a clock period T(2), V1 and V2 cross (cross point Z2), and the comparator outputs a pulse. Since a clock period T(3), V1 and V2 do not cross, and the comparator stops outputting a pulse. According to the above description, the detection and output circuit 700 determines whether the input signal $V_{HV}$ is currently at a rising edge or a falling edge by determining whether the comparator outputs a pulse. Similarly, if the detection and output circuit 700 is configured to output a signal indicating a falling edge when a next clock pulse (corresponding to a pulse m4 at t4 in the right diagram of FIG. 4A) arrives after the comparator stops outputting a pulse, then, as shown in the right diagram of FIG. 4A, the detection and output circuit 700 outputs a signal at t4 to indicate that the $V_{HV}$ changes from a rising edge to a falling edge. As an example, if the monitoring circuit is configured to detect the output of the comparator, when the pulse m4 at time t4 arrives, the output of the monitoring circuit undergoes a flip.

The middle diagram of FIG. 4A is compared with the right diagram of FIG. 4A. When the input signal is $V_{HV}^2$ with a small peak, if a small bias voltage ΔV' is used, compared with the middle diagram of FIG. 4A, the right diagram of FIG. 4A shows that the time when the output signal of the monitoring circuit is flipped is delayed backward by one clock period $T_{sample}$. Compared with the middle diagram of FIG. 4A, in the right diagram, the input signal $V_{HV}$ corresponding to the time when the output signal of the monitoring circuit is flipped is closer to the peak 901, which improves the detection accuracy of the circuit.

According to the above description, in some applications, the IC needs to detect the voltage of the input signal so as to determine whether the input signal is an AC signal or a DC signal.

For example, for an AC-DC controller, the input signal of the current AC-DC controller usually can only be an AC signal, not a DC signal. Therefore, a detection circuit is needed to ensure that the input signal is an AC signal instead of a DC signal. On the other hand, in some cases, a user wants to expand the input signal of the AC-DC controller from AC to AC and DC, such that the user can optimize the system design according to application requirements so as to reduce the cost. The premise is also to determine whether the input signal is AC or DC.

Based on the above analysis of the AC/DC voltage detection circuit provided by the present disclosure, it can be known that in the AC/DC voltage detection circuit provided by the present disclosure, if $V_{HV}$ is AC, when $V_{HV}$ is at a rising edge, the output of the comparator may undergo a flip between high and low levels. When $V_{HV}$ is at a falling edge, the output of the comparator will not undergo a flip between high and low levels.

Referring to FIG. 1, when the input signal $V_{HV}$ is DC, if noise and disturbance are not considered, the first voltage $V_1$ does not change in the clock period $T_{sample}$, and $V_1=V_0$. The voltage at the input terminal of the voltage bias circuit is $V_{in}=V_0=V_1$, and the voltage at the output terminal of the voltage bias circuit 110 is $V_0=V_0+ΔV=V_1+ΔV$. In the clock period $T_{sample}$, $V_{out}$ remains unchanged or basically unchanged (with a little voltage loss). When the switch circuit 120 is connected, $V_2=V_{out}=V_0+ΔV=V_1+ΔV$. When the switch circuit is disconnected, $V_2=V_C=V_{out}=V_0+ΔV=V_1+ΔV$. That is, in the entire clock period, $V_2$ is always higher than $V_1$ by ΔV, that is, $V_2=V_1+ΔV$. $V_2$ and $V_1$ do not cross, so the output terminal of the comparator always outputs a low level. In other words, in the AC/DC voltage detection circuit provided by the present disclosure, when the input signal $V_{HV}$ is a DC signal, if noise and disturbance are not considered, or although $V_{HV}$ fluctuates, the fluctuation range is not enough to complete the surpassing of $V_1$ over $V_2$ in one clock period $T_{sample}$, the output terminal of the comparator 200 will not flip.

In summary, in the AC/DC voltage detection circuit provided by the present disclosure, if disturbance and noise are not considered: when the $V_{HV}$ is an AC signal, the comparator can output a level flip signal at the rising edge of the AC signal; when the $V_{HV}$ is a DC signal, the comparator cannot output a level flip signal.

Therefore, in the detection circuit provided by the present disclosure, the AC/DC characteristic of the input signal $V_{HV}$, that is, whether the input signal is an AC signal or a DC signal, can be determined by detecting the level flip signal output by the comparator by the detection and output circuit 700. For an AC voltage with conforming frequency and voltage amplitude, the circuit 700 can continuously output multiple level flip signals at the rising edge of the $V_{HV}$. For an AC voltage with non-conforming frequency and amplitude and a DC voltage with a noisy fluctuation, because their rising edge cannot last long enough and/or the amplitude is not large enough, the circuit 700 cannot continuously output a sufficient number of level flip signals at the rising edge of the fluctuating voltage. For a DC voltage with very little noise, since there is no detectable rising edge, the circuit 700 cannot output a level flip signal.

Referring to FIGS. 1 and 2A, the input signal $V_{HV}$ is sampled with the clock pulse output by the clock circuit as the sampling pulse. The sampling period is the period $T_{sample}$ of the clock pulse, that is, the rising edge trigger circuit samples the operating voltage received by the input terminal with the preset clock period $T_{sample}$. In one sampling period $T_{sample}$, if the rising amplitude of the input signal is higher than the preset bias voltage $\Delta V$, the output signal of the output terminal (the signal output by the comparator) undergoes at least one target flip between the high and low levels, and the comparator outputs a pulse. If the rising amplitude of the input signal is not greater than the preset bias voltage $\Delta V$, the output signal of the output terminal (the signal output by the comparator) does not undergo a target flip, and the comparator does not output a pulse.

In order to improve the performance of the IC, in the detection circuit provided by the present disclosure, the clock periods are configured for the rising edge trigger circuit to sample the rising edge of an AC voltage of a rated frequency M times, the M being a natural number.

That is, in the detection circuit provided by the present disclosure, the performance of the IC can be improved by appropriately selecting the sampling period $T_{sample}$ and/or the number of the output pulses.

The relationship between the clock period $T_{sample}$ and the detection accuracy will be briefly analyzed below.

Figure 4D:
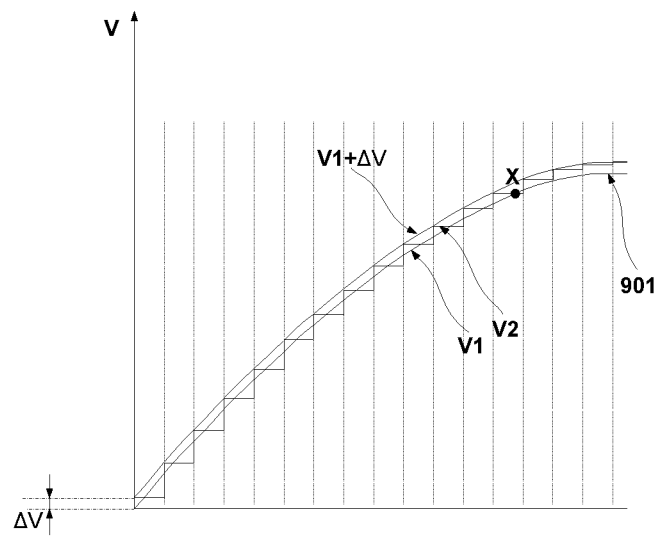
FIG. 4D illustrates a timing diagram of $V_1$ and $V_2$ according to some exemplary embodiments of the present disclosure.
Figure 4E:
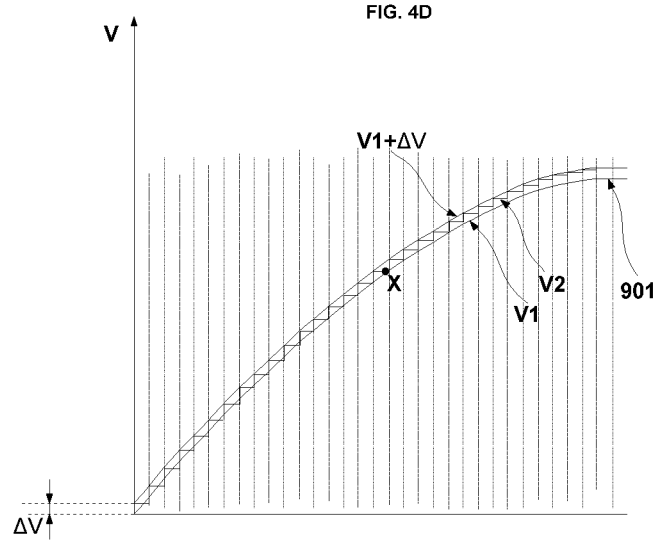
FIG. 4E illustrates a timing diagram of $V_1$ and $V_2$ according to some exemplary embodiments of the present disclosure.
Figure 4F:
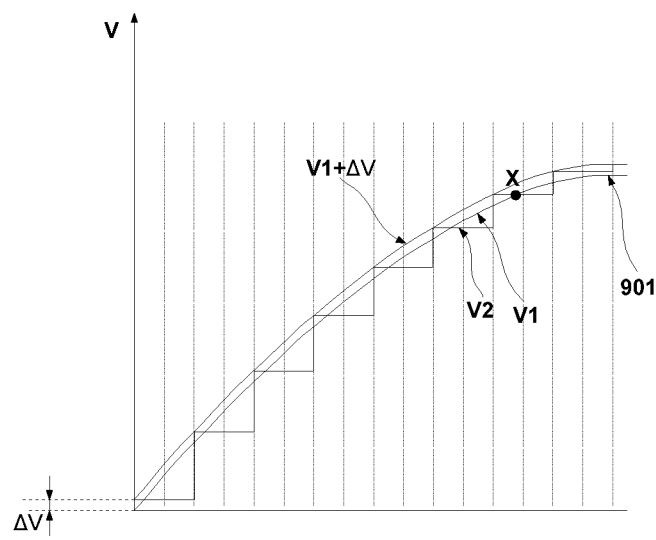
FIG. 4F illustrates a timing diagram of $V_1$ and $V_2$ according to some exemplary embodiments of the present disclosure.

As an example, FIG. 4D illustrates a timing diagram 001 of $V_1$ and $V_2$ according to some exemplary embodiments of the present disclosure; FIG. 4E illustrates a timing diagram 002 of $V_1$ and $V_2$ according to some exemplary embodiments of the present disclosure; FIG. 4F illustrates a timing diagram 003 of $V_1$ and $V_2$ according to some exemplary embodiments of the present disclosure. The timing diagram 001, the timing diagram 002 and the timing diagram 003 correspond to the same circuit structure, the same input signal $V_{HV}$ and the same bias voltage $\Delta V$, but they correspond to different clock periods $T_{sample}$ for sampling the clock pulse. The timing diagram 001 is used as a reference group, with a clock period of $T_{sample}$. The timing diagram 002 and the timing diagram 003 are experimental groups, where the clock period of the timing diagram 002 is $½T_{sample}$, and the clock period of the timing diagram 003 is $2T_{sample}$.

Due to the same circuit structure, the same input signal $V_{HV}$ and the same bias voltage $\Delta V$, the first voltage curves $V_1$ in the timing diagram 001, the timing diagram 002 and the timing diagram 003 are correspondingly the same.

The timing diagram 001 and the timing diagram 002 are compared and analyzed. When the same bias voltage $\Delta V$ and the same input signal $V_{HV}$ are used, in the clock period $½T_{sample}$, the last cross point of $V_2$ and $V_1$ is advanced. That is, compared with the clock period $T_{sample}$, in the clock period $½T_{sample}$, the last cross point of $V_1$ and $V_2$ is farther from the peak of the input signal $V_{HV}$, which leads to a lower detection accuracy.

The timing diagram 001 and the timing diagram 003 are compared and analyzed. When the same bias voltage $\Delta V$ and the same input signal $V_{HV}$ are used, in the clock period $2T_{sample}$, the position of the last cross point of $V_2$ and $V_1$ does not change. Similarly, a clock period $1.2T_{sample}$ is also analyzed. Compared with the clock period $T_{sample}$, in the clock period $1.2T_{sample}$, the last cross point of $V_1$ and $V_2$ is closer to the peak 901 of the input signal, so the detection accuracy is increased.

It should be noted that the analysis of FIG. 4D, FIG. 4E and FIG. 4F is only a simple analysis of the relationship between the clock period and the position of the last cross point in a way of graphical comparison. As analyzed above, due to the periodicity of the sampling clock, the relationship between the clock period and the position of the last cross point may not be a simple positive or negative correlation.

Through the above analysis, it can be determined that the last cross point of $V_1$ and $V_2$ is related to the clock period $T_{sample}$.

In practice, if the sampling period $T_{sample}$ is too small (that is, the sampling frequency is too high), the operation frequency of the comparator will increase, which will reduce the detection speed of the circuit, and the power consumption of the circuit will also increase. In a low-load operating environment, energy consumption is a key performance indicator of the circuit. If the sampling period $T_{sample}$ is too large (that is, the sampling frequency is too low), the number of pulses output by the comparator at a rising edge will decrease, which will reduce the detection accuracy of the circuit.

Therefore, for a given input signal $V_{HV}$, an appropriate clock period $T_{sample}$ can be selected to make the circuit achieve a balance between the detection speed and detection accuracy, thereby improving the performance of the IC.

For ease of description, in the following description of the present disclosure, "$T_{up}$" is used to represent the duration of a continuous rising edge of the input signal $V_{HV}$. In the duration $T_{up}$ of the rising edge, M clock pulse sampling points may be set to obtain the best balance between the detection speed and detection accuracy, where M is a natural number. As an example, M may fall within [10,100]. Correspondingly, the value of the clock period $T_{sample}$ is between $1/100$ and $1/10$ of the duration of the rising edge of the input signal $V_W$. Specifically, M may be any one of 10, 15, 20, 25, 30, 35, 40, 45, 50, 55, 60, 65, 70, 75, 80, 85, 90, 95 and 100, or may be an integer between any two of these numbers. Specifically, M may fall within [18,30]. For example, M may be set to any one of 18, 19, 20, 21, 22, 23, 24, 25, 26, 27, 28, 29 and 30. Specifically, M may fall within [15,25]. For example, M may be set to any one of 15, 16, 17, 18, 19, 20, 21, 22, 23, 24 and 25. For example, M may be 20, that is, the rising edge trigger circuit may sample the $V_{HV}$ or the operating voltage 20 times in a continuous rising edge of the $V_{HV}$ or the operating voltage.

When the input signal $V_{HV}$ is a periodic signal, the M may also be converted into the value of the period $T_{sample}$ or the frequency $f_{sample}$ of the clock pulse without affecting the core principle of the present disclosure.

As an example, when the frequency of the input signal $V_{HV}$ is 50 HZ, for example, the input signal is a mains AC signal without frequency modulation, then the sampling number of the clock pulse set in one rising edge is M, such that the detection circuit can obtain a better balance between the detection speed and detection accuracy. The frequency of the $V_{HV}$ is 50 HZ, and the period of the $V_{HV}$ is 20 ms, so the duration of one rising edge in the input signal is $T_{up}=\frac{1}{4}T_{HV}=5$ ms. Taking M=25 as an example, that is, 25 samplings can be taken in one rising edge, the clock period of the clock pulse is $T_{sample}=200$ μs, and the corresponding frequency of the clock pulse is $f_{sample}=5$ kHZ.

In summary, by selecting an appropriate value of the clock period $T_{sample}$ to make the sampling number in one rising edge be M, the detection circuit can achieve sufficient performance without excessive design.

In some exemplary embodiments, in order to further improve the accuracy of detecting the AC/DC characteristics, when the detection result of the detection and output circuit indicates that, the output signal of the rising edge trigger circuit undergoes preset m target flips (m being a natural number) in the preset M consecutive clock periods, the detection and output circuit generates an AC determination signal. When the detection result of the detection and output circuit indicates that the output signal of the output terminal undergoes less than m target flips at the rising edge of the operating voltage, the detection and output circuit generates a DC determination signal.

The value of m may be related to M. When M takes a larger value, the m may appropriately take a larger value. When M takes a smaller value, the m may appropriately take a smaller value. As an example, the value of m may fall between ¼ and ¾ of M. Specifically, the value of m may fall between ⅓ and ⅔ of M. Specifically, the value of m may be about ½ of M.

As an example, the value of m may be set within [5,30]. As an example, the value of m may be set within [8,12]. For example, m may be set to any one of 8, 9, 10, 11 and 12. For example, when the input signal is a mains AC signal without frequency modulation, the sampling number M of the clock pulse set at a rising edge may be within [15, 25], and the value of m may be set within [8, 12]. Taking M=25 and m=10 as an example, the clock period of the clock pulse may be $T_{sample}=200$ μs, and the frequency of the clock pulse may be $f_{sample}=5$ kHZ. If the comparator outputs no less than 10 pulses in the 25 samplings of the clock pulse in one rising edge, the detection and output circuit generates an AC determination signal. If the comparator outputs less than 10 in the 25 samplings of the clock pulse in one rising edge, the detection and output circuit generates a DC determination signal.

In this way, by selecting a suitable m, the influence of noise and interference in the input signal on the output of the comparator is solved, thereby further improving the accuracy of AC/DC detection.

In summary, in the circuit provided by the present disclosure, by selecting appropriate sampling time and time interval, the performance of the circuit can be improved without over-designing the circuit, which reduces the cost.

In some exemplary embodiments, the AC/DC voltage detection circuit provided by the present disclosure may further include a determination circuit. The determination circuit receives the operating voltage. The determination circuit is configured to determine the magnitude of the operating voltage. Specifically, the determination circuit is configured to determine whether the operating voltage is higher than a preset voltage. When the determination circuit determines that the operating voltage is not lower than the preset voltage, the determination circuit activates the detection and output circuit to detect the change of the operating voltage and the target flip, and then to generate an AC determination signal or a DC determination signal.

Specifically, in the AC determination, the detection and output circuit generates an AC determination signal when: the determination circuit determines that the operating voltage is not lower than the preset voltage, and the detection and output circuit detects that the output signal of the rising edge trigger circuit undergoes preset m target flips in the preset M consecutive clock periods.

Specifically, in the DC determination, the detection and output circuit generates a DC determination signal when: the determination circuit determines that the operating voltage is not lower than the preset voltage, and the detection and output circuit detects that the output signal of the output terminal undergoes less than m target flips at the rising edge of the operating voltage.

As described above, the operating voltage may be obtained by dividing the input voltage $V_{HV}$. Therefore, the determination circuit may also determine the input voltage $V_{HV}$ without affecting the core principle of the present disclosure. For ease of understanding, in the following description of the present disclosure, the determination circuit determines the input voltage $V_{HV}$.

Figure 4G:
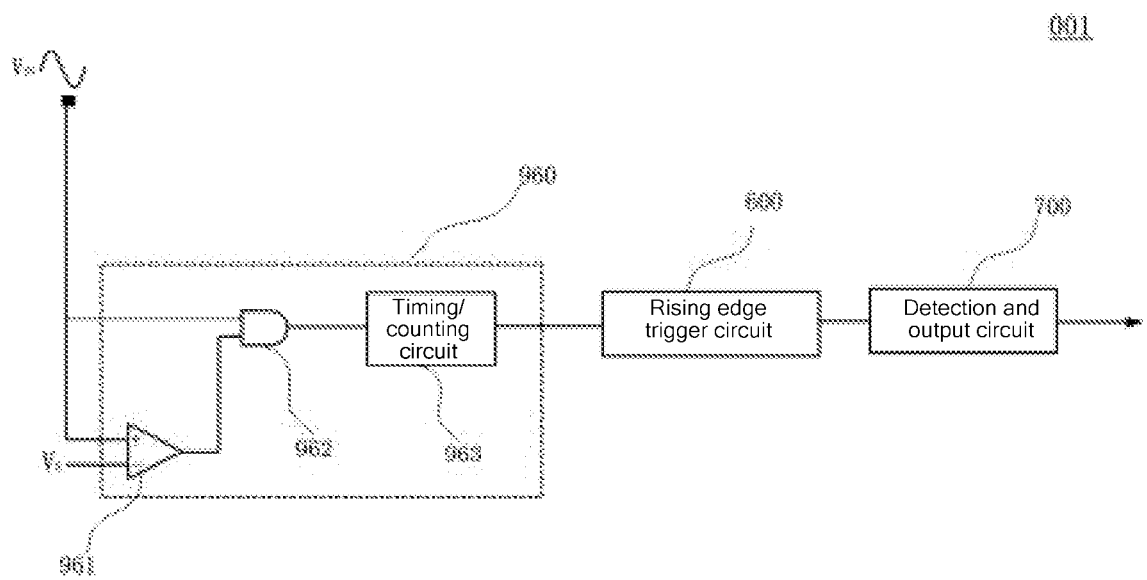
FIG. 4G illustrates a structure of an AC/DC voltage detection circuit according to some exemplary embodiments of the present disclosure.

As an example, FIG. 4G illustrates a structure of another AC/DC voltage detection circuit 001 according to some exemplary embodiments of the present disclosure. Referring to FIG. 4G, the AC/DC voltage detection circuit 001 includes a determination circuit 960. The determination circuit 960 receives the input voltage $V_{HV}$. The determination circuit 960 is configured to determine the magnitude of the input voltage $V_{HV}$. Specifically, the determination circuit 960 determines whether the input voltage $V_{HV}$ is higher than a preset value $V_K$. The preset value $V_K$ may be a minimum voltage value for starting the circuit. In other words, the AC/DC voltage detection circuit starts AC/DC detection only when the input voltage $V_{HV}$ exceeds the preset value $V_K$. When the input voltage $V_{HV}$ is lower than the preset value $V_K$, the AC/DC voltage detection circuit does not start the AC/DC detection. For example, when the input voltage $V_{HV}$ is a mains voltage signal without amplitude modulation, the value of $V_K$ may fall within [20V, 40V]. For example, $V_K$ may be set to 30 V. In this way, when there is no input voltage $V_{HV}$ or the input voltage $V_{HV}$ is too small, the AC/DC voltage detection circuit may be regarded as not operating, so as to reduce power consumption and avoid erroneously outputting a DC indication signal when there is no input signal.

The determination circuit 960 may be implemented in many ways. For example, in the exemplary embodiments shown in FIG. 4G, the determination circuit 960 may include a comparator 961 and an AND gate 962. A positive terminal of the comparator 961 receives the input voltage $V_{HV}$, and a negative terminal thereof receives the preset value $V_K$, so as to determine whether the input voltage $V_{HV}$ is higher than the preset value $V_K$. When the input voltage $V_{HV}$ is higher than the preset value $V_K$, the comparator 961 outputs a high level, and when the input voltage $V_{HV}$ is lower than the preset value $V_K$, the comparator 961 outputs a low level. One input terminal of the AND gate 962 is connected to an output terminal of the comparator 961, and the other input terminal thereof receives the input voltage $V_{HV}$. The AND gate 961, the downstream rising edge trigger circuit 600 and the detection and output circuit 700 output only when the comparator 961 outputs a high level.

Of course, in addition to the circuit structure shown in FIG. 4G, the determination circuit 960 may also adopt other circuit structures without affecting the core principle of the present disclosure. For example, the AND gate 962 may be provided between the rising edge trigger circuit 600 and the detection and output circuit 700. For another example, the AND gate 962 may be provided downstream of the detection and output circuit 700.

In some exemplary embodiments, the determination circuit 960 may further include a timing/counting circuit 963. The timing/counting circuit 963 may be configured to count a duration/number of times the input voltage $V_{HV}$ exceeds the preset value $V_K$ so as to ensure that the input voltage $V_{HV}$ basically stabilizes above the preset value $V_K$ within a certain period of time. For example, the timing/counting circuit 963 may be configured to sample and count the output of the comparator 961, so as to determine a duration when the input voltage $V_{HV}$ exceeds the preset value $V_K$ within 50 ms or determine the number of times the input voltage $V_{HV}$ exceeds the preset value $V_K$ within the 50 ms. When it is determined that the input voltage $V_{HV}$ can basically stabilize above the preset value $V_K$ within the 50 ms, the determination circuit 960 outputs a high level, and the AC/DC voltage detection circuit starts the AC/DC detection.

The structure and connection mode of the timing/counting circuit 963 may also be implemented in multiple ways. For example, the timing/counting circuit 963 may include a counting circuit connected between the AND gate 962 and the rising edge trigger circuit 600. For another example, the timing/counting circuit 963 may include a clock circuit connected to the other input terminal of the AND gate 962.

Based on the previous analysis, the output of the rising edge trigger circuit does not undergo a target flip at the falling edge of the AC signal, that is, the rising edge trigger circuit does not output a pulse at the falling edge of the AC signal. If the AC/DC detection is started at a falling edge, the falling edge of AC signal will be mistaken as one of the DC signal.

Therefore, in the AC/DC voltage detection circuit provided by the present disclosure, the AC/DC detection is prohibited at the falling edge of the AC signal. That is, the AC/DC detection is started only at the rising edge of the AC signal.

Based on the previous analysis, when the input signal $V_{HV}$ changes from a rising edge to a falling edge, the second target circuit is triggered (for example, as shown in FIG. 2A). Therefore, the AC/DC detection may be configured to be started only when the second target circuit outputs a low level. In this way, when the second target circuit outputs a high level, the AC/DC detection is prohibited. Specifically, an inverter may be connected to an output terminal of the second target circuit. A logical AND circuit may be provided downstream of the inverter. One input terminal of the logic AND circuit is connected to an input terminal of the inverter, and the other terminal of the logic AND circuit may be connected to one or more output terminals of the detection and output circuit. In this way, the detection result of the detection and output circuit can be limited to be valid at the rising edge. Of course, other circuit structures may also be adopted to prohibit the AC/DC detection at the falling edge without affecting the core principle of the present disclosure.

In summary, in the AC/DC voltage detection circuit provided by the present disclosure, the voltage bias circuit 110 in the voltage adjustment circuit 100 adds a bias to the operating voltage $V_0$. The bias is stored in the capacitor $C_{hold}$ when the switch is turned on. The bias signal is sampled and held by the switch downstream of the voltage bias circuit 110, the clock signal and the capacitor $C_{hold}$. Slopes of the first voltage signal (direct sample) applied to the first input terminal of the comparator and the second voltage applied to the second input terminal of the comparator are different, such that a crossing occurs in the clock period. The output of the comparator is flipped every time a crossing occurs. By determining whether the comparator outputs a pulse signal, the characteristic of the input electrical signal can be determined, for example, whether the input signal fluctuates, whether the input signal is an AC signal or a DC signal, or whether the input signal is at a rising edge or a falling edge.

In the AC/DC voltage detection circuit provided by the present disclosure, the detection and output circuit 700 can accurately determine the AC/DC characteristic of the input signal according to the pulse output by the comparator, such that the input signal of the AC-DC controller can be expanded from AC to AC and DC. The circuit has a simple structure and a small number of components, which can reduce the cost and volume of the IC. In addition, the circuit has high accuracy and can achieve a balance between the circuit complexity, detection accuracy, sufficiently fast detection speed and low cost, so as to achieve a balance between the optimal performance and the cost of the IC. For example, only by reasonably setting the value of $\Delta V$ and the frequency of the sampling clock $T_{sample}$, the frequency of the pulse output by the comparator can be controlled. Further, for an analog IC (including, but not limited to, a switching power supply controller, an audio/video amplifier or a signal converter), if a digital circuit is used to sample and detect the characteristic of the electrical signal, the addition of a digital design to the analog IC will increase the cost of the IC. In the detection circuit provided by the present disclosure, the input signal $V_{HV}$ may be an analog signal. When the detection circuit is applied to the analog IC, it can greatly reduce the complexity of the analog IC, and can achieve a balance between the circuit complexity, detection accuracy, sufficiently fast detection speed and low cost, so as to achieve a balance between the optimal performance and the cost of the IC.

Figure 5:
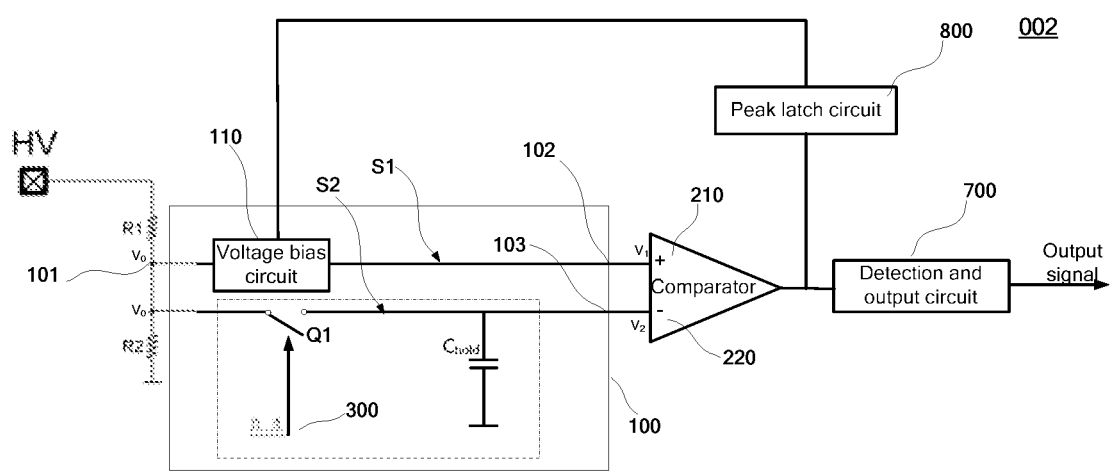
FIG. 5 illustrates a structure of an AC/DC voltage detection circuit according to some exemplary embodiments of the present disclosure.

It should be noted that, for ease of description, in the above description, the detection circuit is described by taking a positive bias voltage as an example. In practice, as an example, the bias voltage may be a negative bias voltage without affecting the core spirit of the present disclosure. For example, the bias voltage may be set to $-\Delta V$. FIG. 5 illustrates a structure of another AC/DC voltage detection circuit 002 according to some exemplary embodiments of the present disclosure.

Referring to FIG. 5, the voltage bias circuit 110 is provided on the first circuit S1. The voltage bias circuit 110 is connected in series with the first output terminal 102 and the input terminal 101 of the adjustment circuit. That is, two ends of the voltage bias circuit 110 are respectively connected to the output terminal 101 and the first output terminal 102 of the adjustment circuit.

The step voltage generating circuit 500 is provided on the second circuit S2. The step voltage generating circuit 500 is connected in series with the input terminal 101 and the second output terminal 103 of the adjustment circuit. That is, two ends of the step voltage generating circuit 500 are respectively connected to the output terminal 101 and the second output terminal 103 of the adjustment circuit. Referring to FIG. 5, the first comparator input terminal 210 of the comparator is a positive terminal, the second comparator input terminal 220 of the comparator is a negative terminal, and the bias voltage is a negative voltage $-\Delta V$.

Figure 6:
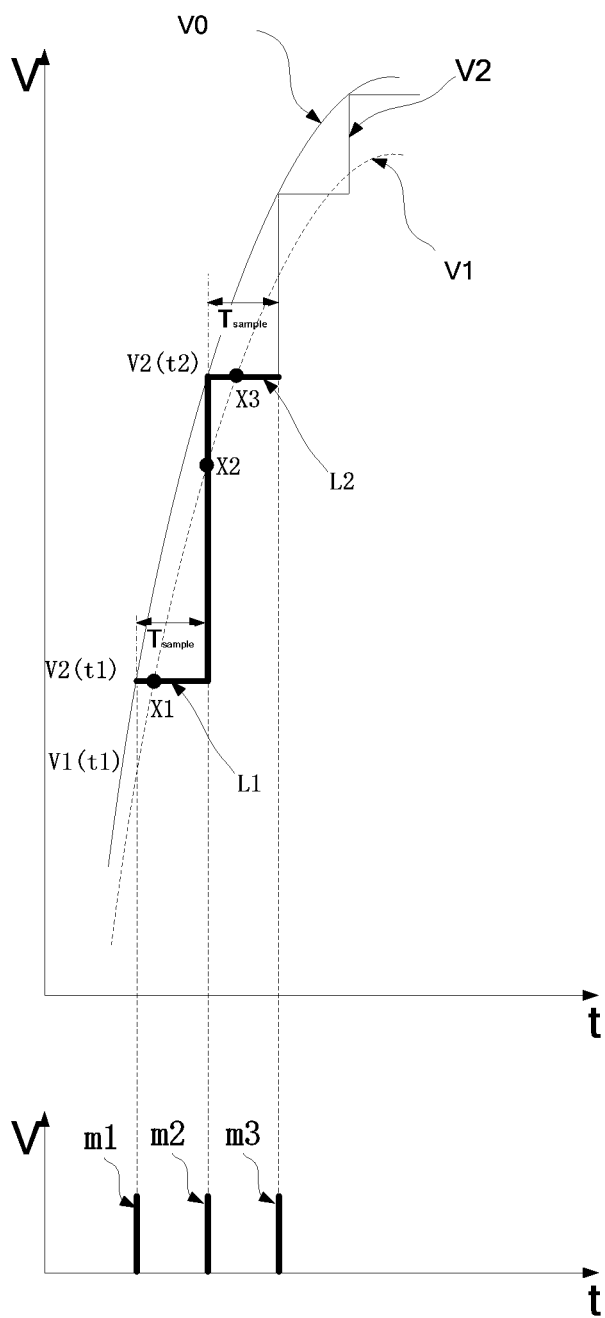
FIG. 6 illustrates a comparison between an operating voltage, a first voltage and a second voltage in the structure of the circuit shown in FIG. 5.

As an example, FIG. 6 illustrates a comparison between the operating voltage $V_0$, the first voltage $V_1$ and the second voltage $V_2$ in the structure of the circuit shown in FIG. 5.

The voltage bias circuit 110 adds a bias voltage to the operating voltage $V_0$ to generate the first voltage $V_1$. The bias voltage is negative, and its absolute value is equal to $\Delta V$, that is, the bias voltage is $-\Delta V$. Therefore, $V_1=V_0-\Delta V$. The timing of the first voltage $V_1$ is indicated by $V_1$ in FIG. 6.

The step voltage generating circuit 500 acts on the operating voltage signal $V_0$ to cause the operating voltage signal $V_0$ to step so as to generate a stepped second voltage $V_2$.

Referring to FIGS. 5 and 6, a switch $Q_1$ is turned on when the clock pulse $m_1$ arrives. The second voltage $V_2$ is equal to the operating voltage $V_0$, which is $V_2(t_1)$. When the switch $Q_1$ is turned on, the capacitor $C_{hold}$ is charged to $V_2(t_1)$. After the clock pulse $m_1$ ends, the switch $Q_1$ is turned off. The capacitor $C_{hold}$ keeps the voltage on the negative terminal of the comparator basically at $V_2(t_1)$ (indicated by the horizontal line L1 in FIG. 6), and the holding time is one clock period $T_{sample}$ of the clock pulse. The "basically stabilize" means that the voltage stabilizing effect of the capacitor $C_{hold}$ allows the second voltage at the second comparator input terminal 220 of the comparator to slightly drop on the basis of $V_2(t_1)$. Such a drop does not exceed the first amplitude, for example, the first amplitude may be 1%, 2%, 3%, 4%, 5%, 6%, 7%, 8%, 9% or 10% of $\Delta V(t_1)$, or may be in an interval between any two of these numbers. It can be seen from FIG. 6 that the first voltage $V_1$ is lower than the second voltage $V_2$ at the beginning of the corresponding clock period $T_{sample}$ indicated by the horizontal line L1. In the clock period $T_{sample}$, the operating voltage $V_0$ rises along the rising edge, the first voltage $V_1$ also rises along the rising edge, but the second voltage $V_2$ remains substantially constant under the action of the capacitor $C_{hold}$. In this clock period, the rising amplitude of the first voltage exceeds the bias voltage, the first voltage $V_1$ and the second voltage $V_2$ cross (cross point X1), and the comparator undergoes a flip.

When the clock pulse $m_2$ arrives, the switch $Q_1$ is connected, and the second voltage $V_2$ instantaneously increases to the operating voltage $V_0$, that is, $V_2(t_2)$. Before the clock pulse $m_2$ arrives, the magnitude of the second voltage $V_2$ is $V_2(t_1)$. The arrival of the clock pulse $m_2$ causes the second voltage $V_2$ to instantaneously rise from $V_2(t_1)$ to $V_2(t_2)$. Before the rise, the magnitude of the second voltage, i.e. $V_2(t_1)$, is lower than that of the first voltage $V_1$, that is, the voltage on the positive terminal of the comparator is higher than that on the negative terminal, and the comparator outputs a high level. After the rise, the magnitude of the second voltage $V_2(t_2)$ is higher than that of $V_1$, that is, the voltage on the positive terminal of the comparator is lower than that on the negative terminal, and the comparator outputs a low level. That is, the arrival of the clock pulse $m_2$ causes the first voltage $V_1$ and the second voltage $V_2$ to cross once (cross point X2), and the comparator flips once.

Meanwhile, when the clock pulse $m_2$ arrives and the switch $Q_1$ is turned on, the capacitor $C_{hold}$ is charged, such that the voltage across the positive and negative terminals of the capacitor $C_d$ becomes $V_2(t_2)$. After the clock pulse $m_2$ ends, the switch $Q_2$ is turned off. The capacitor $C_{hold}$ keeps the second voltage $V_2$ applied to the negative terminal of the comparator at $V_2(t_2)$ (indicated by the horizontal line L2 in FIG. 6), and the holding time is one clock period $T_{sample}$ of the clock pulse.

In summary, a negative bias voltage can also be used to make the first voltage and the second voltage cross in the clock period and make the comparator flip. Thus, it can also be determined whether the input signal is a DC signal or an AC signal by determining the output of the comparator (for example, whether the comparator can output a pulse and the number of output pulses).

It should be noted that, for ease of description, in the above description, the principle of the AC/DC voltage detection circuit is described with the first input terminal of the comparator as a positive terminal and the second input terminal of the comparator as a negative terminal. The first input terminal of the comparator may also be a negative terminal and the second input terminal of the comparator may also be a positive terminal without affecting the core principle of the present disclosure.

For ease of description, in the above description of the present disclosure, the structure of the detection circuit is described by taking the target flip from a low level to a high level as an example. In practice, the target flip may also be a flip from a high level to a low level without affecting the core spirit of the present disclosure.

Figure 7:
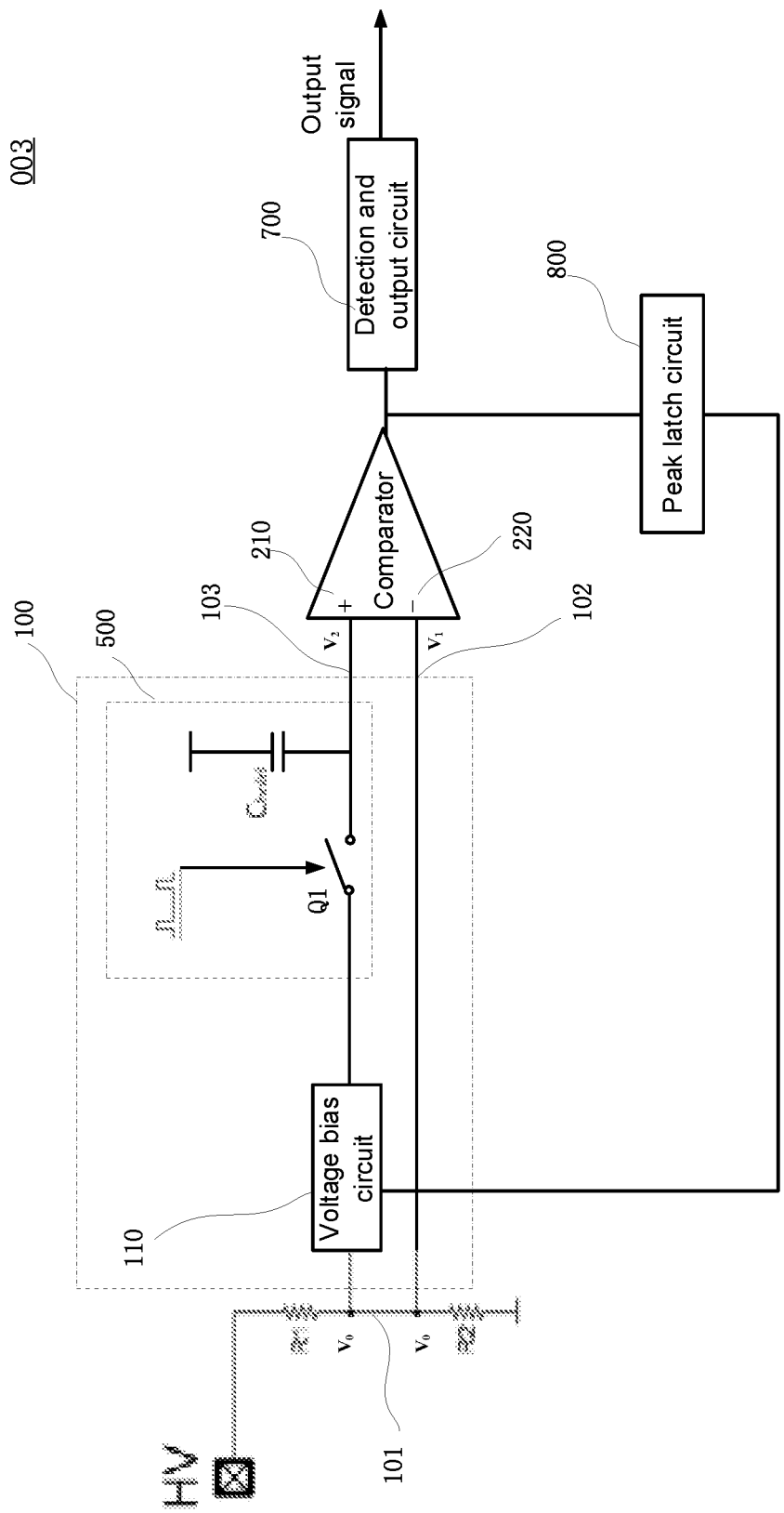
FIG. 7 illustrates a structure of an AC/DC voltage detection circuit according to some exemplary embodiments of the present disclosure.

As an example, FIG. 7 illustrates a structure of an AC/DC voltage detection circuit 003 according to some exemplary embodiments of the present disclosure. The circuit structure shown in FIG. 7 is similar to that shown in FIG. 1, except that in FIG. 7, the first output terminal of the voltage adjustment circuit is connected to the first input terminal of the comparator, and the first input of the comparator is a negative terminal of the comparator. In addition, in FIG. 7, the second output terminal of the voltage adjustment circuit is connected to the second input terminal of the comparator, and the second input terminal of the comparator is a positive terminal of the comparator. That is, the voltage bias circuit 110 is connected in series with the step voltage generating circuit 500 and is provided on the first circuit S1. Therefore, the first voltage is applied to the negative terminal of the comparator, and the second voltage is applied to the positive terminal of the comparator.

The comparison between the first voltage and the second voltage illustrated in FIG. 3B is applicable to the circuit structure shown in FIG. 7. Referring to FIG. 3B, in the circuit structure shown in FIG. 7, for every clock period that comes, the comparator flips once at the arrival of the clock period and flips again during the clock period. In the circuit structure shown in FIG. 7, taking the clock signal $m_2$ as an example, before the clock signal $m_2$ arrives, the second voltage $V_2(t_1)$ is lower than the first voltage $V_1$, that is, the voltage on the positive terminal of the comparator is lower than that on the negative terminal, and the comparator outputs a low level. The arrival of the clock pulse $m_2$ causes the second voltage to rise instantaneously from $V_2(t_1)$ to $V_2(t_2)$. After the rise, the second voltage $V_2(t_2)$ is higher than the first voltage $V_1$, that is, the voltage on the positive terminal of the comparator is higher than that on the negative terminal of the comparator, and the comparator outputs a high level. That is, the arrival of the pulse signal $m_2$ causes the comparator to flip from a low level to a high level. After the pulse signal $m_2$ ends, the second voltage is maintained at $V_2(t_2)$ under the action of the capacitor $C_{hold}$. As the first voltage rises along the rising edge, when the rising amplitude of the first voltage exceeds the bias voltage, the second voltage and the first voltage cross again (cross point X2). Before the cross point X2, the second voltage is higher than the first voltage, that is, the voltage on the positive terminal of the comparator is higher than that on the negative terminal of the comparator, and the comparator outputs a high level. After the cross point X2, the second voltage is lower than the first voltage, that is, the voltage on the positive terminal of the comparator is lower than that on the negative terminal of the comparator, and the comparator outputs a low level. That is, in the clock period $T_{sample}$, the comparator flips from a high level to a low level.

When the clock pulse arrives, the comparator flips from a low level to a high level, and before the next clock pulse arrives, the comparator flips from a high level to a low level. Therefore, it can also be determined whether the input signal is a DC signal or an AC signal by determining the output of the comparator (for example, whether the comparator can output a pulse and the number of output pulses).

In some exemplary embodiments, the devices at the rising edgerising edge trigger circuit 600 may also be connected in other ways without affecting the core principle of the present disclosure.

Figure 8:
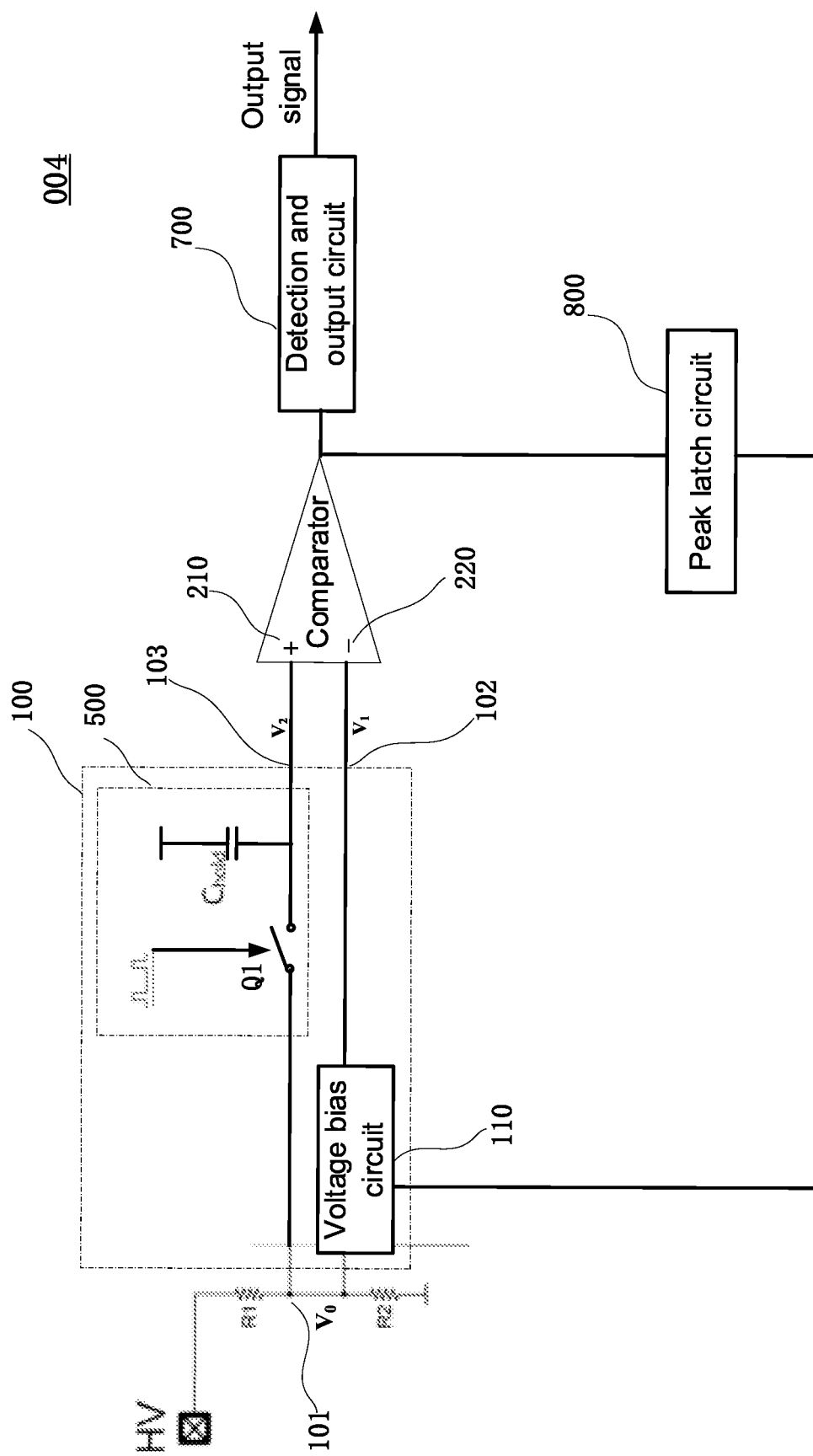
FIG. 8 illustrates a structure of an AC/DC voltage detection circuit according to some exemplary embodiments of the present disclosure.

FIG. 8 illustrates a structure of an AC/DC voltage detection circuit 004 according to some exemplary embodiments of the present disclosure. The circuit structure shown in FIG. 8 is similar to that shown in FIG. 5, except that in FIG. 8, the first output terminal of the voltage adjustment circuit is connected to the first input terminal of the comparator, and the first input of the comparator is a negative terminal of the comparator. In addition, in FIG. 8, the second output terminal of the voltage adjustment circuit is connected to the second input terminal of the comparator, and the second input terminal of the comparator is a positive terminal of the comparator. In other words, the first voltage is applied to the negative terminal of the comparator, and the second voltage is applied to the positive terminal of the comparator. The timing analysis of FIG. 8 may be referred to that of FIG. 5, which will not be repeated herein for the sake of brevity.

In summary, the AC/DC voltage detection circuit provided by the present disclosure adds a bias to the operating voltage $V_0$ through the voltage bias circuit 110 in the voltage adjustment circuit 100. The bias is stored in the capacitor $C_{hold}$ when the switch is turned on. The bias signal is sampled and held by the switch downstream of the voltage bias circuit 110, the clock signal and the capacitor $C_{hold}$. Slopes of the first voltage signal (direct sample) applied to the first input terminal of the comparator and the second voltage applied to the second input terminal of the comparator are different, such that a crossing occurs in the clock period. The output of the comparator is flipped every time a crossing occurs. By determining whether the comparator can output a pulse signal, the fluctuation of the electrical signal can be determined, for example, whether the electrical signal fluctuates, or whether the electrical signal is at a rising edge or a falling edge.

The AC/DC voltage detection circuit provided by the present disclosure can detect the voltage of an AC line. The circuit has a simple structure and a small number of components, which can reduce the cost and volume of the IC. The circuit has high accuracy and can achieve a balance between the circuit complexity, detection accuracy, sufficiently fast detection speed and low cost, so as to achieve a balance between the optimal performance and the cost of the IC. For example, the frequency of the pulse output by the comparator can be controlled only by reasonably setting the value of $\Delta V$ and the frequency of the sampling clock $T_{sample}$.

For an analog IC (including, but not limited to, a switching power supply controller, an audio/video amplifier or a signal converter), if a digital circuit is used to sample and detect the characteristic of the electrical signal, the addition of a digital design to the analog IC will increase the cost of the IC. In the detection circuit provided by the present disclosure, the input signal $V_{HV}$ may be an analog signal. When the detection circuit is applied to the analog IC, it can greatly reduce the complexity of the analog IC, and can achieve a balance between the circuit complexity, detection accuracy, sufficiently fast detection speed and low cost, so as to achieve a balance between the optimal performance and the cost of the IC.

The voltage fluctuation rising edge detection circuit provided by the present disclosure can be used in an AC-DC controller. The voltage fluctuation rising edge detection circuit can detect whether the operating current of the AC-DC controller is AC or DC, thereby expanding the operating current of the AC-DC controller from DC to DC and AC.

The basic concepts are described above, and those skilled in the art may better understand, after reading this detailed disclosure, that the above detailed disclosure is intended to be presented by way of example only and not limitation. Although it is not explicitly stated herein, those skilled in the art may make various changes, improvements and modifications to the present disclosure. For example, the steps in the method of the present disclosure may not necessarily be performed in exactly the order described. These steps may also be performed in part and/or in other combinations as reasonably expected by those of ordinary skill in the art. These changes, improvements and modifications are intended to be included in the present disclosure, and fall within the scope of the embodiments of the present disclosure.

In addition, some terms are used to describe the embodiments of the present disclosure. For example, the terms "an embodiment", "one embodiment" and/or "some exemplary embodiments" mean that a particular feature, structure or characteristic described in the embodiment(s) is included in at least one embodiment of the present disclosure. Therefore, it should be emphasized and understood that two or more references to "an embodiment", "one embodiment" or "an alternative embodiment" in various parts of this disclosure may not necessarily all refer to the same embodiment. In addition, the specific features, structures or characteristics may be appropriately combined in one or more embodiments of the present disclosure.

In addition, those skilled in the art should understand that the aspects of the present disclosure may be described herein in either form of many patentable categories or contexts. These categories and contexts include any new and useful processes, machines, manufacturing or composition issues, or any new and useful improvements. Correspondingly, various aspects of the present disclosure may be fully implemented in hardware or software (including firmware, resident software, microcode, etc.). Alternatively, the software and hardware implementations may be combined, and all of them are generally referred to herein as "blocks", "modules", "engines", "units", "components" or "systems". In addition, the aspects of the present disclosure may take the form of a computer program product embodied in one or more computer-readable media on which computer-readable program codes are present.

Further, the stated order of processing elements or sequences, and the numbers, letters or other names used accordingly, are not intended to limit the claimed processes and methods to any order, unless it is defined in the claims. Although various embodiments have been discussed above through various embodiments that are currently considered to be useful embodiments of the present disclosure, it should be understood that such details are only for such a purpose. The appended claims are not limited to the disclosed embodiments, and on the contrary, they are intended to cover modifications and equivalent arrangements made within the scope of the disclosed embodiments. For example, although the implementation of the various components described above can be embodied in a hardware device, it can also be implemented as a software-only solution, for example, an installation on an existing server or mobile device.

Similarly, it should be understood that in the above description of the exemplary embodiments of the present disclosure, various features are sometimes combined in a single embodiment, drawing or description thereof to simplify the present disclosure and make one or more of the various creative embodiments better understood. However, the method of the present disclosure should not be interpreted as reflecting an intention that the claimed subject matter requires more features than those explicitly recited in each claim. In contrast, an inventive embodiment may have fewer features than all the features of a single previously disclosed exemplary embodiment.

What is claimed is:

1. An alternating current (AC)/direct current (DC) voltage detection circuit, comprising:
    a rising edge trigger circuit, including:
        an input terminal,
        an output terminal,
        an adjustment circuit, including:
            an adjustment circuit input terminal to receive the operating voltage as an AC voltage,
            a first adjustment circuit output terminal to output a first voltage, and
            a second adjustment circuit output terminal to output a second voltage that is stepped, and
        a comparator, including:
            a first comparator input terminal to receive the first voltage,
            a second comparator input terminal to receive the second voltage, and
            a comparator output terminal to output a comparison result of the first voltage and the second voltage, wherein
        the second voltage is different from the first voltage by a bias voltage at the beginning of the clock period,
        the second voltage does not drop by more than a first voltage drop in the clock period,
        the rising edge trigger circuit samples an operating voltage received by the input terminal with a preset clock period,
        the clock period is configured to enable the rising edge trigger circuit to sample M times to an AC voltage of a rated frequency at its rising edge, wherein M is a natural number, and
        when an increase of the operating voltage at the rising edge of the operating voltage within the preset clock period is greater than a preset bias voltage, an output signal of the output terminal undergoes at least one target flip between a high level and a low level; and
    a detection and output circuit, including at least one counting circuit, connected to the output terminal of the rising edge trigger circuit, and configured to detect a change of the operating voltage and the target flip, and configured to record the number of the target flips by the at least one counting circuit, wherein
        when the detection and output circuit detects that the output signal of the rising edge trigger circuit undergoes preset m target flips in M consecutive clock periods, the detection and output circuit generates an AC determination signal, where m is a natural number.

2. The AC/DC voltage detection circuit according to claim 1, wherein when the output signal of the output terminal undergoes less than m target flips at the rising edge of the operating voltage, the detection and output circuit generates a DC determination signal.

3. The AC/DC voltage detection circuit according to claim 1, further comprising:
    a determination circuit to determine whether the operating voltage is higher than a preset voltage, wherein
        when the operating voltage is higher than the preset voltage, the determination circuit activates the detection and output circuit to detect the change of the operating voltage and the target flip.

4. The AC/DC voltage detection circuit according to claim 1, wherein M is in a range of 15-25, and m is in a range of 8-12.

5. The AC/DC voltage detection circuit according to claim 1, wherein a magnitude of the bias voltage is positively correlated with an amplitude of the operating voltage.

6. The AC/DC voltage detection circuit according to claim 1, wherein the first voltage is lower than the second voltage at the beginning of the clock period; and
    when an increase of the first voltage in the clock period exceeds the bias voltage, an output of the comparator undergoes at least one of the target flips.

7. The AC/DC voltage detection circuit according to claim 1, wherein the voltage adjustment circuit further includes:
    a voltage bias circuit, configured to add the bias voltage to an input voltage of the voltage bias circuit; and
    a step voltage generating circuit, configured to convert a voltage input to the step voltage generating circuit into a step voltage.

8. The AC/DC voltage detection circuit according to claim 7, wherein the step voltage generating circuit includes:
    a switch circuit;
    a clock circuit, connected to the switch circuit and controlling the switch circuit to be disconnected or connected according to the clock period to generate the second voltage; and
    a voltage holding circuit, connected to the switch circuit and holding the second voltage after the switch circuit is disconnected, such that the second voltage does not drop by more than the first voltage drop in the clock period.

9. The AC/DC voltage detection circuit according to claim 8, wherein
    the voltage bias circuit includes at least one of a voltage-controlled current source, or a voltage-controlled voltage source;
    the switch circuit includes at least one field-effect transistor (FET); and
    the voltage holding circuit includes at least one capacitor.

10. The AC/DC voltage detection circuit according to claim 7, wherein the first adjustment circuit output terminal is electrically connected to the adjustment circuit input terminal; and the voltage bias circuit is connected in series with the step voltage generating circuit, and the circuits in series are respectively connected to the adjustment circuit input terminal and the second adjustment circuit output terminal.

11. The AC/DC voltage detection circuit according to claim 10, wherein the first comparator input terminal is a positive terminal of the comparator, the second comparator input terminal is a negative terminal of the comparator, and the bias voltage is a positive voltage; or the first comparator input terminal is a negative terminal of the comparator, the second comparator input terminal is a positive terminal of the comparator, and the bias voltage is a positive voltage.

12. The AC/DC voltage detection circuit according to claim 7, wherein the voltage bias circuit is connected in series with the first adjustment circuit output terminal and the adjustment circuit input terminal; and the step voltage generating circuit is connected in series with the adjustment circuit input terminal and the second adjustment circuit output terminal.

13. The AC/DC voltage detection circuit according to claim 12, wherein the first comparator input terminal is a positive terminal of the comparator, the second comparator input terminal is a negative terminal of the comparator, and the bias voltage is a negative voltage; or the first comparator input terminal is a negative terminal of the comparator, the second comparator input terminal is a positive terminal of the comparator, and the bias voltage is a negative voltage.

14. The AC/DC voltage detection circuit according to claim 1, further comprising:

a voltage divider circuit, wherein a terminal of the voltage divider circuit is connected to an input voltage, another terminal of the voltage divider circuit is connected to a ground wire, and the voltage divider circuit divides the input voltage into the operating voltage to be output.

15. The AC/DC voltage detection circuit according to claim 7, further comprising:

a latch circuit, wherein a terminal of the latch circuit is connected to the comparator output terminal of the comparator and another terminal of the latch circuit is connected to the voltage bias circuit, the latch circuit records and latches peak data based on an output signal of the comparator output terminal of the comparator, and transfers the peak data to the voltage bias circuit to allow the voltage bias circuit to adjust the bias voltage based on the peak data.

* * * * *